US012655536B2

(12) United States Patent
Von Dollen et al.

(10) Patent No.: US 12,655,536 B2
(45) Date of Patent: Jun. 16, 2026

(54) APPARATUS FOR RETROGRADE SOLVOTHERMAL CRYSTAL GROWTH, METHOD OF MAKING, AND METHOD OF USE

(71) Applicant: SLT Technologies, Inc., Los Angeles, CA (US)

(72) Inventors: Paul M. Von Dollen, Brush Prairie, WA (US); Mark P. D'Evelyn, Vancouver, WA (US)

(73) Assignee: SLT Technologies, Inc., San Diego, CA (US)

( * ) Notice: Subject to any disclaimer, the term of this patent is extended or adjusted under 35 U.S.C. 154(b) by 244 days.

(21) Appl. No.: 18/505,971

(22) Filed: Nov. 9, 2023

(65) Prior Publication Data

US 2024/0158951 A1      May 16, 2024

Related U.S. Application Data

(60) Provisional application No. 63/424,805, filed on Nov. 11, 2022.

(51) Int. Cl.
*C30B 7/10*        (2006.01)
*C30B 29/40*       (2006.01)

(52) U.S. Cl.
CPC ............ *C30B 7/105* (2013.01); *C30B 29/403* (2013.01)

(58) Field of Classification Search
CPC .......... C30B 7/10; C30B 29/403; C30B 7/105
See application file for complete search history.

(56) References Cited

U.S. PATENT DOCUMENTS 3,101,259 A      8/1963   Sawyer
4,300,979 A      11/1981  Kolb et al.
(Continued)

FOREIGN PATENT DOCUMENTS

AT          395985 B       4/1993
CN          111593398   *  8/2020
(Continued)

OTHER PUBLICATIONS

Daisuke Tomida et al., Effect of halogen species of acidic mineralizer on solubility of GaN in supercritical ammonia, Journal of Crystal Growth 325 (2011), pp. 52-54.
(Continued)

*Primary Examiner* — Robert M Kunemund
(74) *Attorney, Agent, or Firm* — Procopio, Cory, Hargreaves & Savitch LLP

(57)        ABSTRACT

According to the present disclosure, techniques related to processing of materials for growth of crystals are provided. More particularly, the present disclosure provides apparatus and methods for heating of seed crystals suitable for use in conjunction with a high-pressure vessel for crystal growth of a material having a retrograde solubility in a supercritical fluid, including crystal growth of a group III metal nitride crystal by an ammonobasic or ammonoacidic technique, but there can be others. In other embodiments, the present disclosure provides methods suitable for synthesis of crystalline nitride materials, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and
(Continued)

hydrogen generation, photodetectors, integrated circuits, and transistors, among other devices.

20 Claims, 25 Drawing Sheets

(56) References Cited

U.S. PATENT DOCUMENTS

| | | | |
|---|---|---|---|
| 4,373,988 | A | 2/1983 | Bauser et al. |
| 6,656,615 | B2 | 12/2003 | Dwilinski et al. |
| 7,078,731 | B2 | 7/2006 | D'Evelyn et al. |
| 7,642,122 | B2 | 1/2010 | Tysoe et al. |
| 7,705,276 | B2 | 4/2010 | Giddings et al. |
| 8,021,481 | B2 | 9/2011 | D'Evelyn |
| 8,430,958 | B2 | 4/2013 | D'Evelyn |
| 8,979,999 | B2 | 3/2015 | D'Evelyn |
| 9,299,555 | B1 | 3/2016 | Alexander et al. |
| 9,724,666 | B1 | 8/2017 | Rajeev et al. |
| 10,029,955 | B1 | 7/2018 | Rajeev et al. |
| 10,036,099 | B2 | 7/2018 | D'Evelyn et al. |
| 10,174,438 | B2 | 1/2019 | Pakalapati et al. |
| 2005/0152820 | A1 | 7/2005 | D'Evelyn et al. |
| 2008/0083741 | A1 | 4/2008 | Giddings et al. |
| 2009/0301387 | A1 | 12/2009 | D'Evelyn |
| 2009/0320744 | A1 | 12/2009 | D'Evelyn et al. |
| 2009/0320745 | A1 | 12/2009 | D'Evelyn et al. |
| 2010/0031876 | A1 | 2/2010 | D'Evelyn |
| 2010/0111808 | A1* | 5/2010 | Pimputkar ............. C30B 7/105 |
| | | | 117/106 |
| 2010/0285657 | A1* | 11/2010 | Hashimoto ............ C30B 25/14 |
| | | | 257/E21.097 |
| 2011/0183498 | A1 | 7/2011 | D'Evelyn |
| 2014/0205840 | A1 | 7/2014 | Aoki et al. |
| 2015/0132926 | A1 | 5/2015 | D'Evelyn et al. |
| 2015/0345868 | A1 | 12/2015 | Grohs et al. |
| 2016/0194781 | A1 | 7/2016 | Pimputkar et al. |
| 2016/0376726 | A1 | 12/2016 | Hashimoto |
| 2016/0376727 | A1 | 12/2016 | Hashimoto |
| 2022/0136128 | A1 | 5/2022 | D'Evelyn et al. |
| 2023/0110306 | A1 | 4/2023 | D'Evelyn et al. |
| 2024/0026562 | A1 | 1/2024 | D'Evelyn et al. |
| 2024/0026563 | A1 | 1/2024 | D'Evelyn et al. |
| 2024/0158948 | A1 | 5/2024 | Von Dollen et al. |
| 2024/0158949 | A1 | 5/2024 | Von Dollen |
| 2024/0158950 | A1 | 5/2024 | Von Dollen et al. |
| 2024/0159348 | A1 | 5/2024 | Von Dollen |

FOREIGN PATENT DOCUMENTS

| | | |
|---|---|---|
| CN | 111593398 A | 8/2020 |
| CN | 216768741 U | 6/2022 |
| EP | 2505696 A1 | 10/2012 |
| JP | 2013067556 A | 4/2013 |
| JP | 2013095643 A | 5/2013 |
| WO | 2017205882 | 7/2017 |

OTHER PUBLICATIONS

R. Dwilinski et al., Excellent crystallinity of truly bulk ammonothermal GaN, Journal of Crystal Growth 310 (2008), pp. 3911-3916.
D. Peters, Ammonothermal Synthesis of Aluminium Nitride, Journal of Crystal Growth 104 (1990), pp. 411-418.
Ehrentraut et al., Ammonothermal Crystal Growth of Gallium Nitride—A brief discussion of critical issues, Journal of Crystal Growth, Elsevier, Amsterdam, Sep. 1, 2010, 5 pages.
PCT/US2022/077867, International Search Report and Written Opinion dated Jan. 20, 2023, 11 pages.
PCT/US2023/070631, International Search Report and Written Opinion dated Nov. 7, 2023, 10 pages.
PCT/US2023/079423, International Search Report and Written Opinion dated Feb. 27, 2024, 11 pages.
PCT/US2023/078816, International Search Report and Written Opinion dated Feb. 9, 2024, 15 pages.
PCT/US2023/079391, International Search Report and Written Opinion dated Feb. 8, 2024, 10 pages.
PCT/US2023/079417, International Search Report and Written Opinion dated Feb. 27, 2024, 15 pages.
Anonymous: "Stainless Steel Perforated Metal", Anping Shengjia Hardware & Mesh Co., Ltd., Apr. 16, 2021 (Apr. 16, 2021), pp. 1-4, XP093128625 <https://web.archive.org/web/20210416114542/https://www.sjhardwaremesh.com/en/products/stainless-steel/stainless-steel-perforated-metal.html> , 5 pages.
PCT/US2023/070635, International Search Report and Written Opinion dated Nov. 7, 2023, 11 pages.

* cited by examiner

Cooler nutrient rich fluid

Fluid sealed inside the wedge structures acquires temperature closer to sidewall Walls on which GaN seeds are positioned in the hottest region within the growth zone Static Temperature [K]

953.5
953.2
952.9
952.6
952.3
952.0
951.7
951.4
951.1
950.8
950.5

APPARATUS FOR RETROGRADE SOLVOTHERMAL CRYSTAL GROWTH, METHOD OF MAKING, AND METHOD OF USE

CROSS-REFERENCE TO RELATED APPLICATIONS

This application claims priority to U.S. Provisional Application Ser. No. 63/424,805 filed Nov. 11, 2022, which is herein incorporated by reference in its entirety.

BACKGROUND

Field

The present disclosure generally relates to processing of materials in supercritical fluids for growth of crystals useful for forming bulk substrates that can be used to form a variety of optoelectronic, integrated circuit, power device, laser, light emitting diode, photovoltaic, and other related devices.

Description of Related Art

The present disclosure relates generally to techniques for processing materials in supercritical fluids, such as growth of single crystals. Examples of such crystals include metal oxides, such as $MXO_4$ crystals, where M represents Al or Ga and X represents P or As, and metal nitrides, such as GaN, AlN, InN, InGaN, AlGaN, and AlInGaN. More specifically, embodiments of the disclosure include techniques for controlling parameters associated with material processing within a capsule or liner disposed within a high-pressure apparatus enclosure. Gallium nitride containing crystalline materials are useful as substrates for manufacture of optoelectronic and electronic devices, such as lasers, light emitting diodes, solar cells, photoelectrochemical water splitting and hydrogen generation devices, photodetectors, integrated circuits, and transistors, among other devices.

Supercritical fluids are used to process a wide variety of materials. A supercritical fluid is often defined as a substance beyond its critical point, i.e., critical temperature and critical pressure. A critical point represents the highest temperature and pressure at which the substance can exist as a vapor and liquid in equilibrium. In certain supercritical fluid applications, the materials being processed are placed inside a pressure vessel or other high-pressure apparatus. In some cases, it is desirable to first place the materials inside a container, liner, or capsule, which in turn is placed inside the high-pressure apparatus. In operation, the high-pressure apparatus provides structural support for the high pressures generated within the container or capsule holding the materials. The container, liner, or capsule provides a closed/sealed environment that is chemically inert and impermeable to solvents, solutes, and gases that may be involved in or generated by the process.

Supercritical fluids provide an especially ideal environment for growth of high-quality crystals, that is, a solvothermal process, in large volumes and low costs. In many cases, supercritical fluids possess the solvating capabilities of a liquid with the transport characteristics of a gas. Thus, on the one hand, supercritical fluids can dissolve significant quantities of a solute for recrystallization. On the other hand, the favorable transport characteristics include a high diffusion coefficient, so that solutes may be transported rapidly through the boundary layer between the bulk of the supercritical fluid and a growing crystal, and also a low viscosity, so that the boundary layer is very thin and small temperature gradients can cause facile self-convection and self-stirring of the reactor. This combination of characteristics enables, for example, the growth of hundreds or thousands of large α-quartz crystals in a single growth run in supercritical water.

In some applications, such as crystal growth, the pressure vessel or capsule also includes a baffle plate that separates the interior into different chambers, e.g., a top half and a bottom half. The baffle plate typically has a plurality of random or regularly spaced holes to enable fluid flow and heat and mass transfer between these different chambers, which hold the different materials being processed along with a supercritical fluid. For example, in typical crystal growth applications, one end of the capsule contains seed crystals and the other end contains nutrient material. In addition to the materials being processed, the capsule contains a solid or liquid that forms the supercritical fluid at elevated temperatures and pressures and, typically, also a mineralizer to increase the solubility of the materials being processed in the supercritical fluid. In some cases, the mineralizer is a mixture of two or more substances [e.g., S. Tysoe, et al., U.S. Pat. No. 7,642,122 (2010)]. In operation, the capsule is heated and pressurized toward or beyond the critical point, thereby causing the solid and/or liquid to transform into the supercritical fluid. In some applications the fluid may remain subcritical, that is, the pressure or temperature may be less than the critical point. However, in all cases of interest here, the fluid is superheated, that is, the temperature is higher than the boiling point of the fluid at atmospheric pressure. The term "supercritical" will be used throughout to mean "superheated", regardless of whether the pressure and temperature are greater than the critical point, which may not be known for a particular fluid composition with dissolved solutes.

In a number of solvothermal crystal growth systems the solubility is "normal", that is, the solubility of the substance to be crystallized increases with increasing temperature of the supercritical fluid. In such cases a nutrient material is placed in the hotter end of the growth chamber and seed crystals in the cooler end, with the cooler end above the hotter end so that free convection mixes the fluid. Examples of these systems include α-quartz in supercritical water with NaOH as mineralizer and GaN in supercritical ammonia with acidic mineralizers $NH_4Cl$, $NH_4Br$, or $NH_4I$ [D. Tomida, et al., J. Crystal Growth 325, 52 (2011)]. In other cases the solubility is "retrograde", that is, the solubility decreases with increasing temperature and the relative positions of the nutrient material and seeds within the growth chamber are reversed. Examples of systems with retrograde solubility include $AlPO_4$ (berlinite) in supercritical water with HCl as mineralizer [E. D. Kolb and R. A. Laudise, U.S. Pat. No. 4,300,979 (1981)] and AlN in supercritical ammonia with basic mineralizer $KNH_2$ [D. Peters, J. Crystal Growth 104, 411 (1990)]. GaN in supercritical ammonia with basic mineralizer $KNH_2$ similarly exhibits retrograde solubility [R. Dwilinski, et al., J. Crystal Growth 310, 3911 (2008)]. GaN in supercritical ammonia with acidic mineralizer $NH_4F$ also exhibits retrograde solubility [M. D'Evelyn, et al., U.S. Pat. No. 7,078,731 (2006)], in contrast to the other acidic mineralizers mentioned above.

A challenge associated with crystal growth in a retrograde solubility system is that the hottest points in the growth chamber are typically on the wall surrounding the seed crystals, with the consequence that adventitious nuclei may form on the walls and grow preferentially with respect to the seed crystals. Wall crystallization may decrease the material efficiency of the process, that is, the fraction of dissolved nutrient material that crystallizes on the seed crystals, and may also interfere with the growth of crystals proximate to the walls. The severity of this wall deposition problem may be sensitive to the temperature distribution within the crystal growth zone and the temperature difference between the nutrient zone and the crystal growth zone.

Therefore, what is needed are improved apparatus and methods for controlling the internal temperature distribution during solvothermal crystal growth where the solubility is retrograde, in order to reduce adventitious wall deposition on surfaces in the growth zone and improve the crystal growth process.

SUMMARY

According to the present disclosure, techniques related to processing of materials for growth of crystals are provided. More particularly, the present disclosure provides apparatus and methods for heating of seed crystals suitable for use in conjunction with a high-pressure vessel for crystal growth of a material having a retrograde solubility in a supercritical fluid, including crystal growth of a group III metal nitride crystal by an ammonobasic or ammonoacidic technique, but there can be others. In other embodiments, the present disclosure provides methods suitable for synthesis of crystalline nitride materials, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

Embodiments of the disclosure include an apparatus for solvothermal crystal growth, comprising: an enclosure that comprises an interior region and a central axis that extends in a first direction; and a plurality of seed mounts disposed within the interior region, wherein a surface of each of the seed mounts is configured to receive a seed crystal. Each of the plurality of seed mounts are disposed in an array that extends in the first direction. At least a portion of a seed mount region is disposed between the surface of each of the seed mounts and an inner surface of the enclosure, wherein the seed mount region comprises a heat transfer medium. The seed mount regions are in direct contact with the inner surface of the enclosure or are disposed proximate to the inner surface of the enclosure. The enclosure being configured to contain a supercritical fluid at a pressure above about 5 megapascals and a temperature above about 200° C.

Embodiments of the disclosure include an apparatus for solvothermal crystal growth, comprising: an enclosure that comprises an interior region and a central axis that extends in a first direction; one or more heating elements disposed within the interior region of the enclosure; and a plurality of seed mounts disposed within the interior region, wherein a surface of each of the seed mounts is configured to receive a seed crystal. Each of the plurality of seed mounts are disposed in an array that extends in the first direction. At least a portion of a seed mount region is disposed between the surface of each of the seed mounts and at least one of the one or more heating elements disposed within the interior region of the enclosure, wherein the seed mount region comprises a heat transfer medium. The seed mount regions are in direct contact with at least one of the one or more heating elements disposed within the interior region of the enclosure or are disposed proximate to at least one of the one or more heating elements disposed within the interior region of the enclosure. The enclosure being configured to contain a material at a pressure above about 5 megapascal and at a temperature above about 200° C.

The present disclosure achieves these benefits and others in the context of known process technology. However, a further understanding of the nature and advantages of the present disclosure may be realized by reference to the latter portions of the specification and attached drawings.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

According to the present disclosure, techniques related to processing of materials for solvothermal growth of crystals are provided. More particularly, the present disclosure provides improved heater designs and a thermal control system suitable for use in conjunction with a high-pressure vessel for solvothermal crystal growth of a material having a retrograde solubility in a supercritical fluid, including crystal growth of a group III metal nitride crystal by an ammonobasic or ammonoacidic technique, but there can be others. In other embodiments, the present disclosure provides methods suitable for synthesis of crystalline nitride materials, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

The disclosure includes embodiments that may relate to an apparatus for making a composition, such as a crystalline nitride material. The disclosure includes embodiments that may relate to a method of making and/or using the composition.

Approximating language, as used herein throughout the specification and claims, may be applied to modify any quantitative representation that could permissibly vary without resulting in a change in the basic function to which it may be related. Accordingly, a value modified by a term such as "about" may be not to be limited to the precise value specified. In at least one instance, the variance indicated by the term about may be determined with reference to the precision of the measuring instrumentation. Similarly, "free" may be combined with a term; and, may include an insubstantial number, or a trace amount, while still being considered free of the modified term unless explicitly stated otherwise.

Figure 1B:
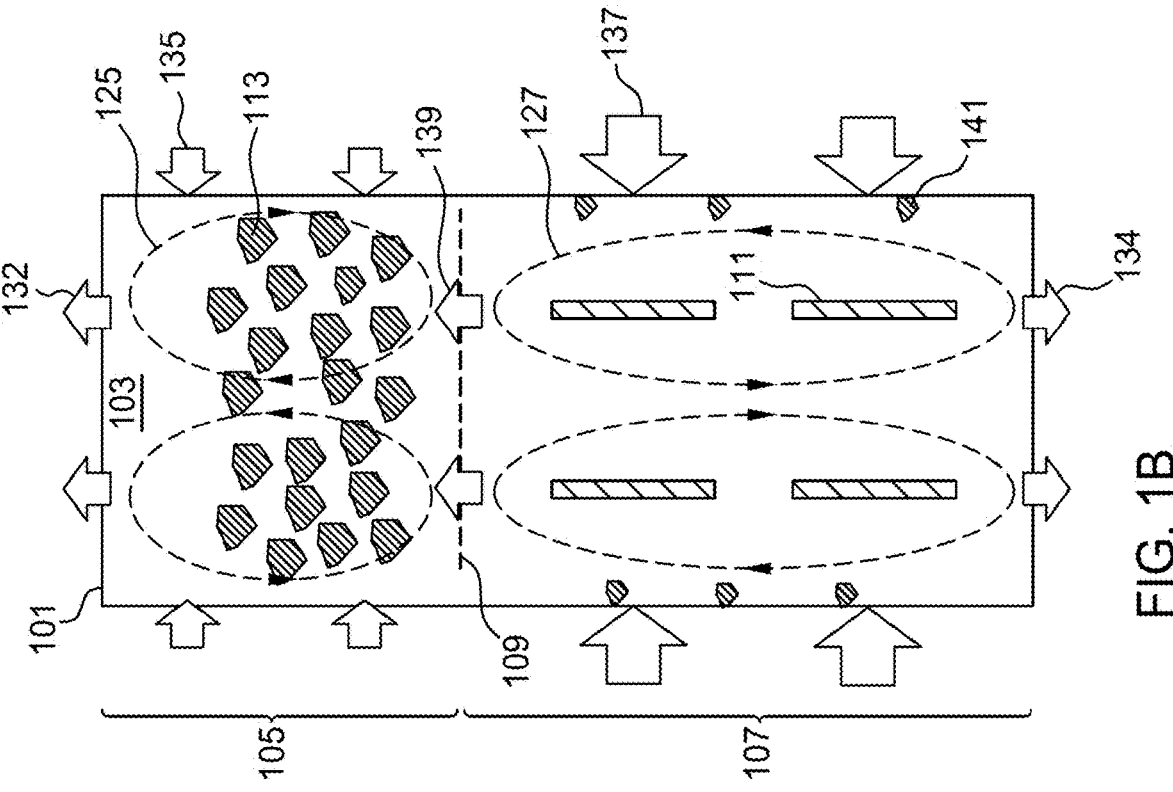
FIGS. 1A, 1B, and 1C are a schematic diagram showing heat fluxes into a growth chamber for crystals by a solvothermal process with retrograde solubility and associated wall deposition.
Figure 1A:
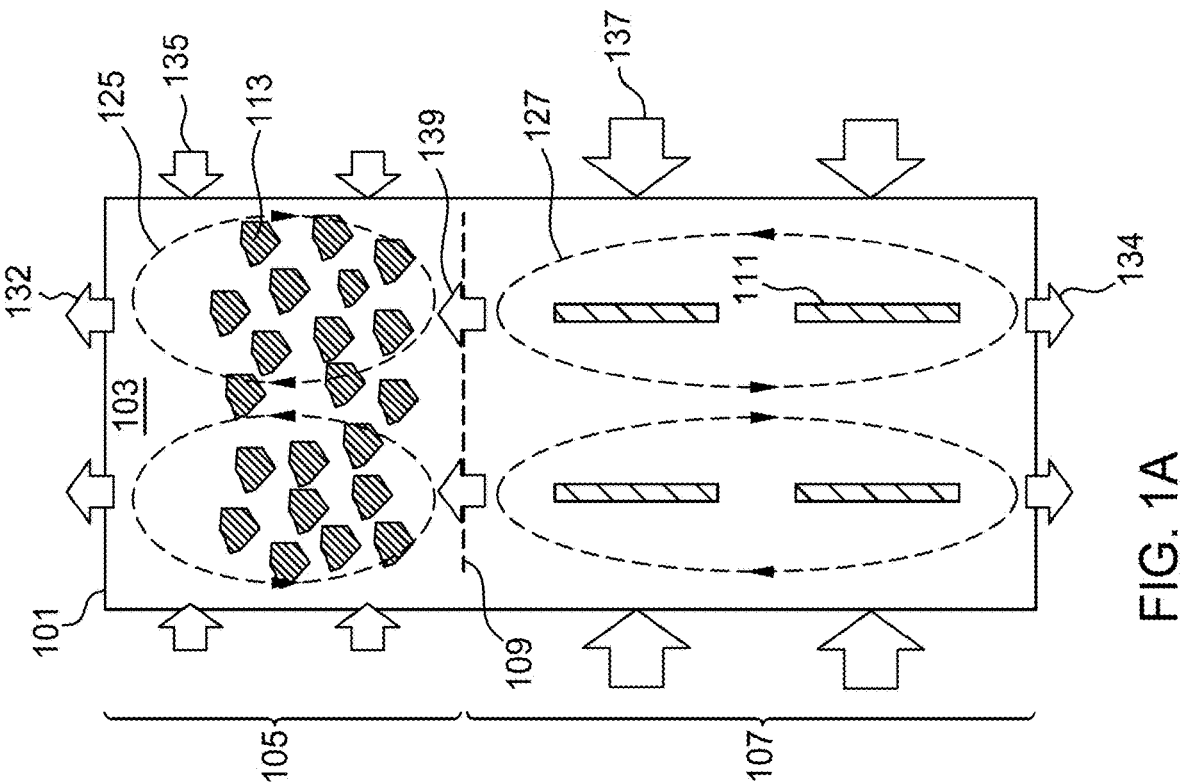
Figure 1C:
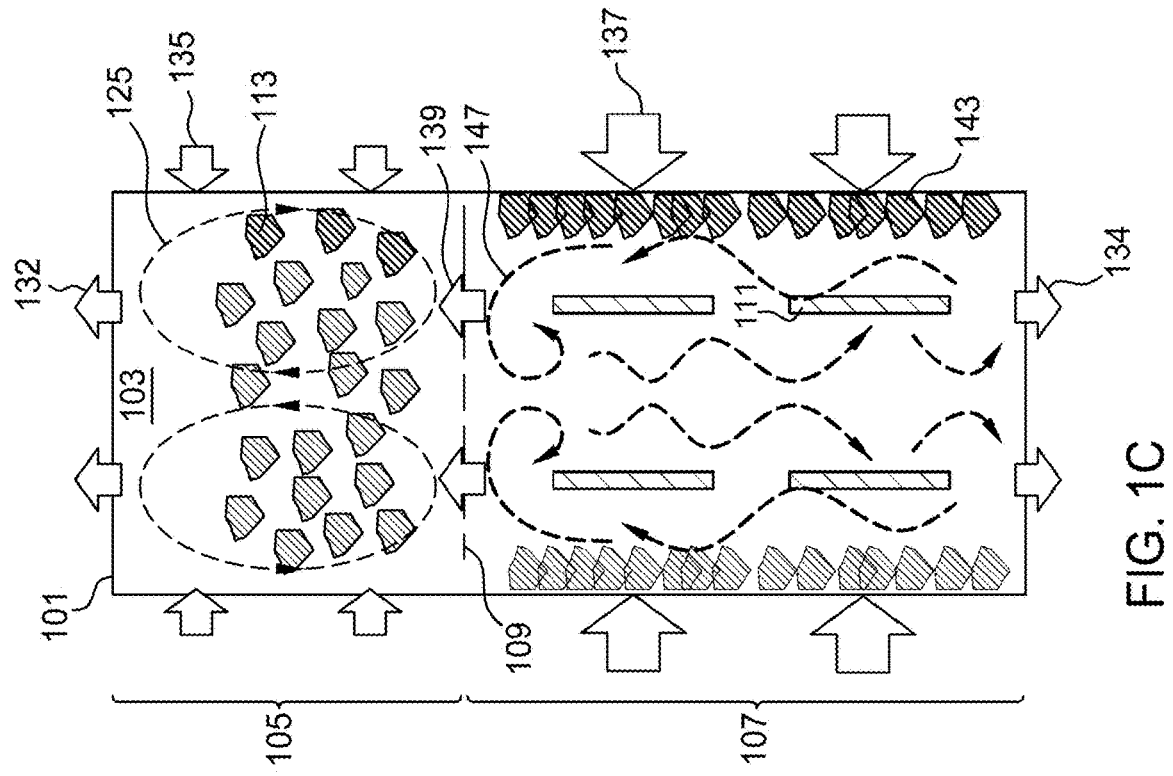

The technical challenge addressed by the present disclosure is illustrated schematically in FIGS. 1A-1C. Referring to FIG. 1A, a growth chamber 101 may include or consist of the inner surface of an autoclave or pressure vessel, the inner surface of liner within an autoclave, the inner surface of a capsule within an autoclave or within an internally-heated high-pressure apparatus, or the like. As used here, an autoclave refers to a thick-walled pressure vessel for processing materials at elevated temperature and pressures. An internally-heated high-pressure apparatus, which is also capable of processing materials at elevated temperature and pressure, may also be considered a pressure vessel, although its construction may be quite different than that of a conventional pressure vessel. The autoclave, pressure vessel, or internally-heated high-pressure apparatus will normally have a cylindrical shape and be vertically oriented. The interior volume 103 is filled with a supercritical fluid, such as ammonia or water, in which a mineralizer is dissolved. Growth chamber 101 may be divided into an upper chamber 105 and a lower chamber 107 by a baffle 109. Baffle 109 may include one or more disks, conical portions, spheroidal portions, or the like, with one or more perforations and annular gaps with respect to growth chamber 101, to allow for restricted fluid motion through the baffle. One or more seed crystals 111 are suspended within lower chamber 107 from furniture (not shown), and one or more chunks of polycrystalline nutrient 113 is placed within upper chamber 105. In certain embodiments, polycrystalline nutrient 113 is placed within one or more baskets (not shown), wherein a basket may include a partially-enclosed structural support, which can include one or more of a perforated plate, perforated cylindrical elements, or other perforated members, or a wire mesh, that is configured to retain the polycrystalline nutrient 113. This configuration is suitable for crystal growth in a system with retrograde solubility, with etching of polycrystalline nutrient 113 occurring in upper chamber 105 and growth of crystalline material on seed crystals 111 occurring in lower chamber 107.

Growth chamber 101 may be heated to a temperature distribution suitable for crystal growth by means of one or more electric heaters (not shown). In some configurations, a heater suitable for an autoclave will generally include heating elements that surround the autoclave body, and include separately controlled hot zones surrounding the upper chamber 105 and the lower chamber 107. In some other configurations, a heater will include heating elements that include separately controlled hot zones surrounding the upper chamber 105 and the lower chamber 107 and are placed within a cylindrical high strength enclosure. Conditions suitable for crystal growth are achieved by heating lower chamber 107 to a temperature that is higher than that of upper chamber 105, causing growth zone free convection 127 to occur within lower chamber 107 and nutrient zone free convection 125 to occur within upper chamber 105. The temperature difference between lower chamber 107 and upper chamber 105 may be between about 1 degree Celsius and about 100 degrees Celsius, between about 3 degrees Celsius and about 30 degrees Celsius, or between about 5 degrees Celsius and about 20 degrees Celsius. Under steady-state growth conditions the temperature distribution within growth chamber 101 is quasi-steady state and the rate of deposition of crystalline material in lower chamber 107 is equal to the rate of etching of polycrystalline nutrient in upper chamber 105. Therefore, under steady-state conditions the net heat flux through the boundary of growth chamber 101 is zero or, put differently, heat flux inward through certain portions of the boundary of growth chamber 101 is counter-balanced by heat flow outward through other portions of the boundary of growth chamber 101. While the precise details of the heat flux distribution will depend on the precise power distribution applied to the heater, in general the growth zone heat flux 137, through the cylindrical perimeter of lower chamber 107, will flow inward, so as to enable lower chamber 107 to be hotter than upper chamber 105. For the same reason, baffle heat flux 139 will flow upward, from lower chamber 107 to upper chamber 105. In the simple case that the heater is cylindrical, the bottom heat flux 134 and the top heat flux 132, through the bottom and top portions of the boundary of growth chamber 101, respectively, will flow outward. Depending on details, nutrient zone heat flux 135, through the cylindrical perimeter of upper chamber 105, may be outward or inward.

As a consequence of the heat fluxes shown schematically in FIG. 1A, the hottest surfaces within growth chamber 101 will typically be on the perimeter of lower chamber 107. For a system with retrograde solubility, the thermodynamic driving force for deposition will be maximum on these surfaces, and therefore nuclei 141 may form on these surfaces, as shown schematically in FIG. 1B. Furthermore, since the surfaces where nuclei 141 form are the hottest surfaces within growth chamber 101, nuclei 141 will grow faster than seed crystals 111. As the crystal growth process continues, therefore, nuclei 141 may coalesce into a continuous polycrystalline film 143, as shown schematically in FIG. 1C. The roughness and thickness of continuous polycrystalline film 143 may cause modification of growth zone free convection 147. Growth on seed crystals 111 may be impeded due both to competition with continuous polycrystalline film 143 for dissolved nutrient material and to the perturbed growth zone free convection 147. In extreme cases, when the temperature difference between continuous polycrystalline film 143 and seed crystals 111 becomes large and the flux of dissolved nutrient from upper chamber 105 to lower chamber 107 is inhibited, for example, by depletion of polycrystalline nutrient 113 or clogging of one or more of holes and annular gaps within baffle 109, seed crystals can be etched rather than growing while the continuous polycrystalline film 143 continues to grow.

An additional consequence of a non-optimum temperature distribution associated with excessive temperatures in the side walls of the lower chamber 107 is that the bottom portion of lower chamber 107 may have a temperature minimum, which may give rise to stagnant fluid flow due to the suppression or disruption of the convective fluid flow currents and thus a non-optimum flow of fluid over seed crystals 111.

Figure 2:
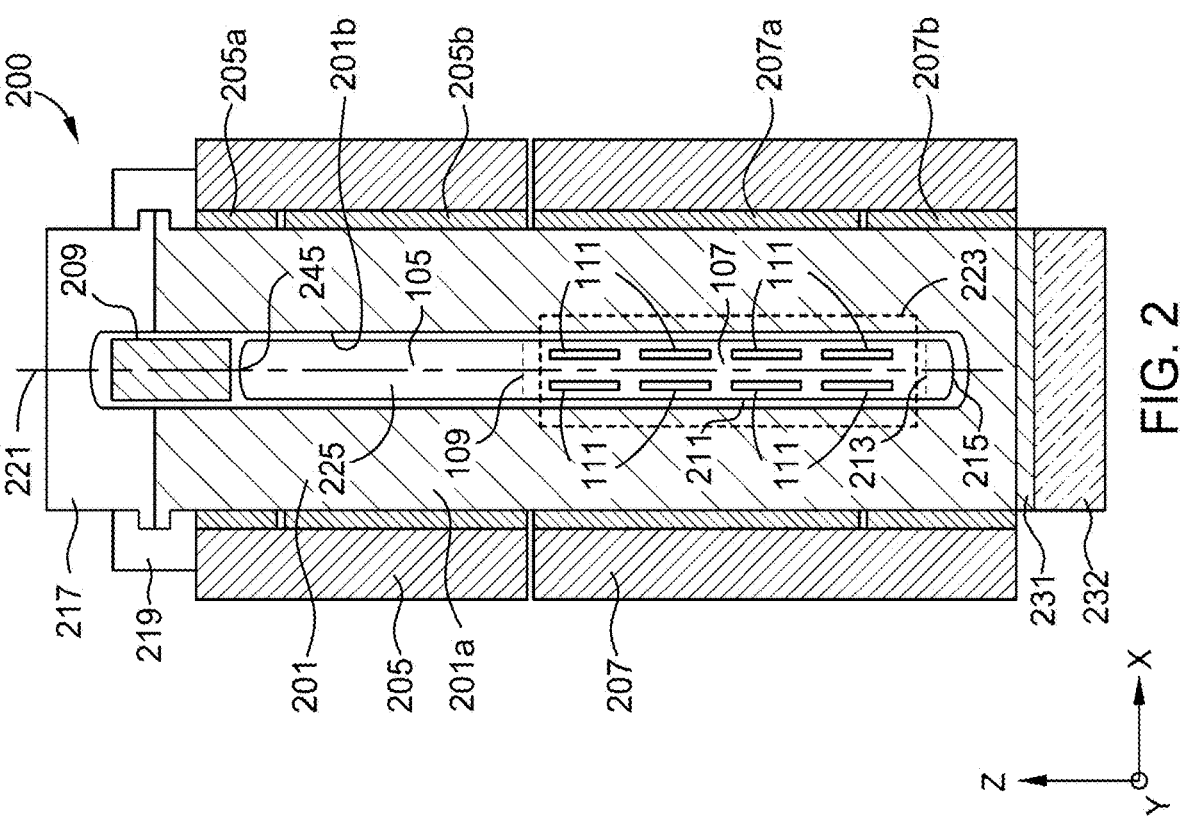
FIG. 2 is a schematic diagram showing a pressure vessel apparatus according to an embodiment of the current disclosure.

FIG. 2 is a simplified diagram of a high-pressure apparatus according to an embodiment of the present disclosure. This diagram is merely an example, which should not unduly limit the scope of the claims herein. One of ordinary skill in the art would recognize other variations, modifications, and alternatives. As shown, the present disclosure provides an apparatus for high pressure crystal or material processing, e.g., GaN, AlN, InN, InGaN, AlGaN, and AlInGaN. Other processing methods include hydrothermal crystal growth of oxides and other crystalline materials, hydrothermal or ammonothermal syntheses, and hydrothermal decomposition, and others. Of course, there can be other variations, modifications, and alternatives.

Referring to FIG. 2, a high-pressure apparatus and related methods for processing materials in supercritical fluids are disclosed. In certain embodiments, the improved heater is employed as a component of an autoclave. The autoclave may be capable of processing a material in a fluid at a pressure above about 5 MPa and below about 500 MPa, below about 400 MPa, below about 300 MPa, below about 200 MPa, or below about 100 MPa, at temperatures between about 50 degrees Celsius and about 900 degrees Celsius, such as between about 100 degrees Celsius and about 600 degrees Celsius, between about 150 degrees Celsius and about 500 degrees Celsius, or between about 200 degrees Celsius and about 400 degrees Celsius. Referring to FIG. 2, autoclave 200 includes an autoclave body 201 that includes a wall 201*a* that includes an inner surface 201*b*. The upper portion of autoclave body 201 may be surrounded by at least one upper heater 205 and the lower portion of autoclave body may be surrounded by at least one lower heater 207, each of which may include insulation. Upper heater 205 may include one, two, or more independently-controllable hot zones, for example, top tail zone 205*a* and top main zone 205*b*. Lower heater 207 may include one, two, or more independently-controllable hot zones, for example, bottom main zone 207*a* and bottom tail zone 207*b*. Upper heater 205 and lower heater 207 may be physically joined into a unitary component but are typically independently controllable. In certain embodiments, a liner 211 is placed within a cavity of autoclave body 201. The inner surface of liner 211, or the inner surface 201*b* of autoclave body 201, if liner 211 is not present, can be used to form a cylindrical chamber 225 in which the methods for processing materials in supercritical fluids can be performed. The cylindrical chamber 225, which can also be referred to as a growth chamber, includes a central axis 221 that extends through the upper and lower portions of the autoclave body 201. Liner 211 may be formed from or may include one or more of platinum, palladium, iridium, a Pt/Ir alloy, gold, or silver. Liner 211 may also include or be formed from one or more of titanium, rhenium, copper, iron, nickel, stainless steel, zirconium, tantalum, molybdenum, niobium, alloys thereof, and the like. A baffle 109 may be positioned within liner 211, if it is present, and/or the interior of autoclave body 201. Baffle 109 may include one or more disks, conical portions, spheroidal portions, or the like, with one or more perforations and annular gaps with respect to the inner diameter of liner 211, if present, to allow for restricted fluid motion through the baffle. In certain embodiments, a bottom baffle 213 may be provided within a certain distance of the bottom surface 215 of liner 211, if the latter is present, or of the bottom inner surface of the interior of autoclave body 201. Baffle 109 and bottom baffle 213 may be formed from or may include one or more of platinum, palladium, iridium, a Pt/Ir alloy, gold, silver, titanium, rhenium, copper, iron, nickel, stainless steel, zirconium, tantalum, molybdenum, niobium, alloys thereof, and the like. Bottom baffle 213 may have the form of a flat disk. Bottom baffle 213 may include one or more holes, which may have a diameter between about 1 millimeter and about 25 millimeters. An annular gap may be present between the outer diameter of bottom baffle 213 and the inner diameter of liner 211, if the latter is present, or of the inner diameter of autoclave body 201, if liner 211 is not present, between about 0.5 millimeter and about 25 millimeters.

As will be discussed further below, a cylindrical chamber, such as cylindrical chamber 225, will include a plurality of seed mounts 403 (e.g., FIGS. 4A-4D) on which the seed crystals 111, illustrated in FIG. 2, are disposed in a spaced-apart vertical array of seed crystals 111 that extend in a first direction (i.e., Z-direction) from a bottom surface of the interior region of the cylindrical chamber 225. The spaced-apart vertical array of seed crystals 111 are supported by seed mounts 403 that are configured to support the seed crystals 111 thereon during processing. In other words, the seed mounts 403 are configured in a spaced-apart vertical array 223 to support the seed crystals during processing. The plurality of crystal-supporting seed mounts 403 may also be positioned within a lateral array of seed mounts 403 (e.g., FIG. 4A) at each level of the vertical array 223, and be aligned in an orthogonal relationship to the vertical array 223 that extends in the first direction. In one example, the lateral array of seed mounts 403 can include a circumferential array of seed mounts 403 that are positioned a radial distance R from the central axis 221, which is orthogonal to the first direction, as shown in the cross-sectional view shown in FIG. 4A. In another example, the lateral array of seed mounts 403 can include a radially aligned array of seed mounts 403 that are aligned in a radial direction relative to the central axis 221, as shown in the cross-sectional view shown in FIG. 6A.

In certain embodiments, autoclave 200 further includes autoclave cap 217 and closure fixture 219, as shown schematically, plus a gasket (not shown). The configuration shown in FIG. 2 is a schematic representation of a Grayloc™ seal. In other embodiments, autoclave 200 includes one or more of an unsupported Bridgman seal, an o-ring seal, a c-ring seal, a confined gasket seal, a bolted closure, an AE™ closure, an EZE-Seal™, a Keuntzel closure, a Zipper-Clave™ closure, a threadless pin closure, or a Gasche™ gasket seal. In certain embodiments, autoclave 200 further includes a cap, closure fixture, and seal on the lower end, in addition to the cap, closure fixture, and seal on the upper end.

Autoclave body 201, autoclave cap 217, and closure fixture 219 may each be fabricated from a material selected from a group consisting of steel, low-carbon steel, SA723 steel, SA266 carbon steel, 4340 steel, A-286 steel, iron based superalloy, nickel based superalloy, cobalt based superalloy, Inconel 718, Rene 41, 304 stainless steel, 310 stainless steel, 316 stainless steel, 340 stainless steel, 410 stainless steel, and 17-4 precipitation hardened stainless steel, zirconium and its alloys, titanium and its alloys, and other materials commonly known as Monel®, Inconel®, Hastelloy®, Udimet® 500, Stellite®, Rene® 41, and Rene® 88. One or more of the components comprising autoclave body 201, autoclave cap 217, and closure fixture 219 may undergo a heat treatment operation. In certain embodiments, autoclave body 201 includes a demountable seal at the bottom as well as at the top.

Autoclave 200 may further comprise a bottom end heater 231 that is thermally coupled to the bottom portion of autoclave body 201 and may include thermal insulation 232. Bottom end heater 231 generates a power distribution that is approximately azimuthally uniform about the central axis of autoclave body 201. The power level in bottom end heater 231, relative to the power level in lower heater 207 and upper heater 205, along with the radial dependence of the power density within bottom end heater 231, may be chosen so as to maintain a temperature distribution along bottom surface 215 that is uniform to within 10 degrees Celsius, within 5 degrees Celsius, within 2 degrees Celsius, within 1 degree Celsius, within 0.5 degree Celsius, or within 0.2 degree Celsius. In certain embodiments, the power level in bottom end heater 231, relative to the power level in lower heater 207 and upper heater 205, along with the radial dependence of the power density within bottom end heater 231, is chosen so as to maintain an average temperature of bottom surface 215 that is equal to the average temperature within a specified height range of the inner surface of liner 211, or of the inner surface of autoclave body 201 if liner 211 is not present, to within 20 degrees Celsius, within 10 degrees Celsius, within 5 degrees Celsius, within 2 degrees Celsius, or within 1 degree Celsius. The specified height range is measured with respect to the bottom surface 215. In certain embodiments the specified height is approximately 1 centimeter, 5 centimeters, 10 centimeters, 20 centimeters, or 25 centimeters. In certain embodiments, the bottom end heater 231 is configured with at least two or at least three independently-controllable hot zones.

In certain embodiments, autoclave 200 further includes a top insulator/heater 209. In certain embodiments, top insulator/heater 209 includes or consists of a load-bearing thermal insulator, for example, zirconia or another ceramic material with a low thermal conductivity. In certain embodiments, top insulator/heater also has capability to generate heat, for example, by means of electrical connections through autoclave cap 217. In certain embodiments, top insulator/heater 209 includes one or more of a cartridge heater, a cable heater, a disk heater, or the like. The dimensions of top insulator/heater 209 and its power level, if present, along with the power levels in lower heater 207 and upper heater 205, along with the radial dependence of the power density within top insulator/heater 209, may be chosen so as to maintain a temperature distribution along top surface 245 that is uniform to within 10 degrees Celsius, within 5 degrees Celsius, within 2 degrees Celsius, or within 1 degree Celsius. In addition, the dimensions of top insulator/heater 209 and the power levels of upper heater 205 and lower heater 207 may be chosen to maintain top surface 245 at an average temperature that is equal to the average temperature within a specified height, measured with respect to top surface 245, of the inner surface of liner 211, or of the inner surface of autoclave body 201, if liner 211 is not present, to within 20 degrees Celsius, within 10 degrees Celsius, within 5 degrees Celsius, within 2 degrees Celsius, or within 1 degree Celsius. In certain embodiments the specified height is approximately 1 centimeter, 5 centimeters, 10 centimeters, 20 centimeters, or 25 centimeters. In certain embodiments, the top insulator/heater 209 is configured with at least two or at least three independently-controllable hot zones.

Further details of the fabrication and properties of bottom end heater 131 and of top insulator/heater 209 are described in U.S. patent application Ser. No. 17/963,004, which is hereby incorporated by reference in its entirety.

Figure 3:
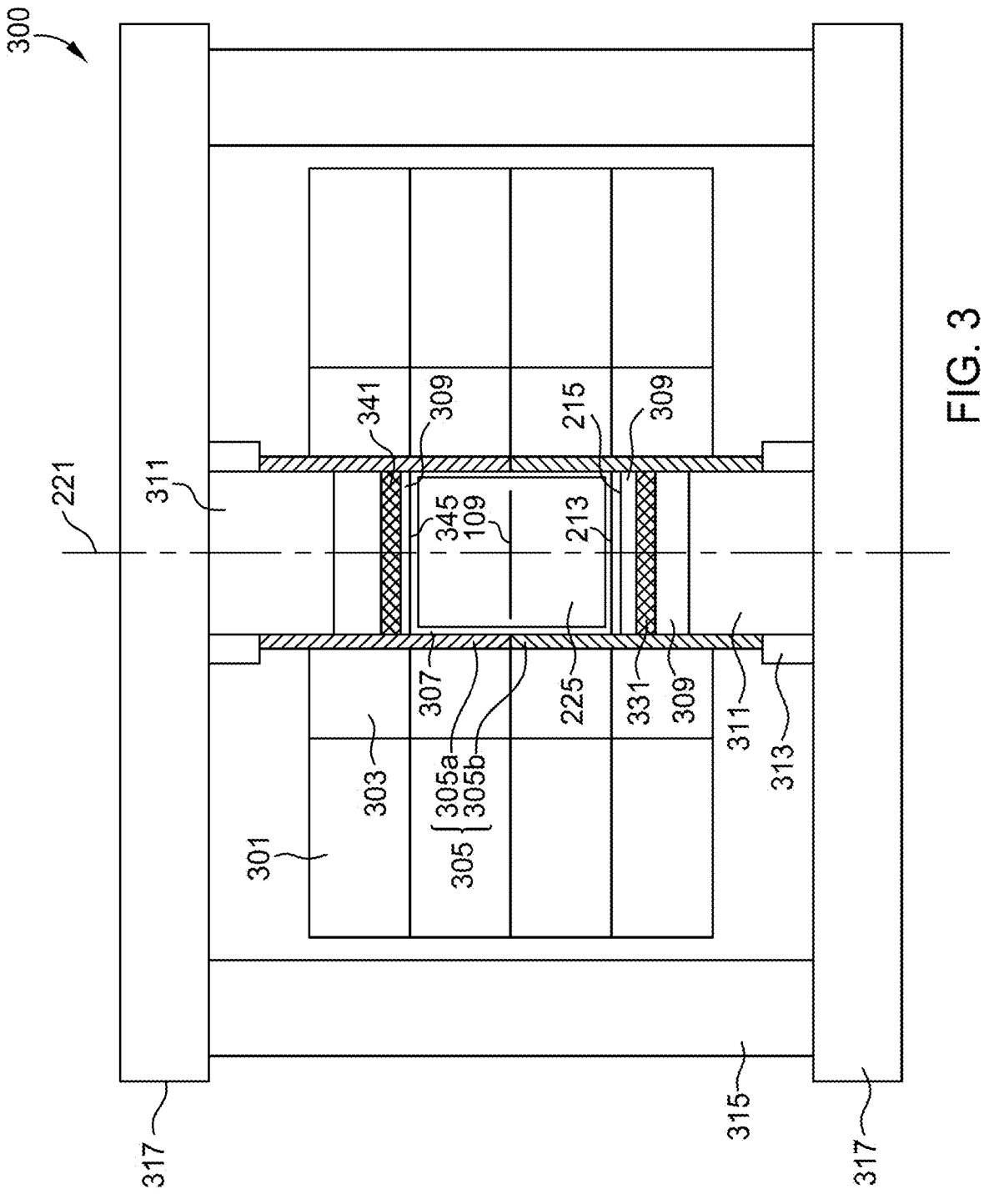
FIG. 3 is a schematic diagram showing an internally-heated pressure vessel apparatus according to an embodiment of the current disclosure.

FIG. 3 is a simplified diagram of an internally-heated high-pressure apparatus according to an embodiment of the present disclosure. This diagram is merely an example, which should not unduly limit the scope of the claims herein. One of ordinary skill in the art would recognize other variations, modifications, and alternatives. As shown, the present disclosure provides an apparatus for high pressure crystal or material processing, e.g., GaN, AlN, InN, InGaN, AlGaN, and AlInGaN. Other processing methods include hydrothermal crystal growth of oxides and other crystalline materials, hydrothermal or ammonothermal syntheses, and hydrothermal decomposition, and others. Of course, there can be other variations, modifications, and alternatives.

Referring to FIG. 3, a high-pressure apparatus and related methods for processing supercritical fluids are disclosed. In certain embodiments, the improved heater is employed as a component of an internally-heated high-pressure apparatus. The apparatus provides adequate containment in all directions which, for a typical cylindrical vessel, can be classified as radial and axial. Furthermore, depending on the specifics of the design parameters, the apparatus is capable of operating at temperatures between 200 degrees Celsius and 1500 degrees Celsius, pressures between about 5 MPa and about 2000 MPa, and for whatever length of time is necessary to grow satisfactory bulk crystals, for example, between about 1 hour and about 180 days. The internally-heated high-pressure apparatus 300 may include a stack of one or more ring assemblies to provide radial confinement, comprising a high strength enclosure ring 301 and a ceramic ring 303. The stack may include greater than 2, greater than 5, greater than 10, greater than 20, greater than 30, greater than 50, or greater than 100 ring assemblies. The stack surrounds heater or heating member 305 and capsule 307 and may be supported mechanically by at least one support plate (not shown). The stack may provide radial confinement for pressure generated within capsule 307 and transmitted outward through heater 305. Heater 305 includes an upper heater 305a and a lower heater 305b. Each of upper heater 305a and lower heater 305b may include one, two, or more independently-controllable hot zones. Upper heater 305a and lower heater 305b may be physically joined into a unitary component but are typically independently controllable. The interior of heater 305 may define a processing chamber, into which capsule 307 may be placed. In the case that the ring assemblies in the die stack are comprised of high strength enclosure ring 301 and ceramic ring 303, there may be an interference fit between the two members in each ring assembly. Means for external cooling of the one or more ring assemblies or radial restraints may be provided. In certain embodiments, capsule 307 includes an inner capsule member and an outer capsule member (not shown). The interior of capsule 307 may define a cylindrical chamber 225 in which the methods for processing materials in supercritical fluids can be performed. The cylindrical chamber 225 includes a central axis 221 that extends through the upper and lower portions of the internally-heated high-pressure apparatus 300.

Axial confinement of pressure generated within capsule 307 may be provided by end plugs 311, crown members 317, and tie rods or tie rod fasteners 315. End plugs 311 may comprise zirconium oxide or zirconia. End plugs 311 may be surrounded by end plug jackets 313. End plug jackets may provide mechanical support and/or radial confinement for end plugs 311. End plug jackets 313 may also provide mechanical support and/or axial confinement for heater 305. End plug jackets 313 may comprise steel, stainless steel, an iron-based alloy, a nickel-based alloy, or the like. In certain embodiments, tie rod fasteners 315 are arranged in a configuration that provides axial loading of two or more ring assemblies. Further details are provided in U.S. Pat. Nos. 9,724,666 and 10,174,438, which are hereby incorporated by reference in their entirety.

Crown members 317 and tie rod fasteners 315 may comprise a material selected from a group consisting of steel, low-carbon steel, SA723 steel, SA266 carbon steel, 4340 steel, A-286 steel, iron based superalloy, 304 stainless steel, 310 stainless steel, 316 stainless steel, 340 stainless steel, 410 stainless steel, 17-4 precipitation hardened stainless steel, zirconium and its alloys, titanium and its alloys, and other materials commonly known as Monel®, Inconel®, Hastelloy®, Udimet® 500, Stellite®, Rene® 41, and Rene® 88.

The internally-heated high-pressure apparatus 300 may include a pressure transmission medium 309 proximate to the axial ends of capsule 307 and to end plugs 311 according to a specific embodiment. Pressure transmission medium 309 may include multiple components, for example, one or more disks. The pressure transmission medium may comprise sodium chloride, other salts, or phyllosilicate minerals such as aluminum silicate hydroxide or pyrophyllite, or other materials, according to a specific embodiment.

Capsule 307, which may also be referred to as a process capsule, may be formed from or may include one or more of platinum, palladium, iridium, a Pt/Ir alloy, gold, or silver. Capsule 307 may also include or be formed from one or more of titanium, rhenium, copper, iron, nickel, stainless steel, zirconium, tantalum, molybdenum, niobium, alloys thereof, and the like. Capsule 307 may further include an outer, support capsule, to provide additional mechanical strength. The support capsule may include or consist of one or more of steel, stainless steel, carbon steel, iron-based alloy or superalloy, nickel, nickel-based alloy or superalloy, Inconel® nickel-chromium iron alloy, Hastelloy® nickel-molybdenum-chromium alloy, René® 41 nickel-based alloy, Waspalloy® nickel-based alloy, Mar-M 247° polycrystalline cast nickel-based alloy, Monel® nickel-copper alloy, Stellite® cobalt-chromium alloy, copper, copper-based alloy, zirconium, niobium, molybdenum, tantalum, tungsten, rhenium, platinum, platinum-based alloy, palladium, iridium, ruthenium, rhodium, osmium, titanium, vanadium, chromium, gold, silver, or aluminum, combinations thereof, and the like. Further details about capsule 307 are described in U.S. Pat. No. 10,029,955, which is hereby incorporated by reference in its entirety.

A baffle 109 may be positioned within capsule 307, dividing the internal volume of capsule 307 into an upper chamber and a lower chamber. Baffle 109 may include one or more disks, conical portions, spheroidal portions, or the like, with one or more perforations and annular gaps with respect to the inner diameter of capsule 307 to allow for restricted fluid motion through the baffle. Baffle 109 may be formed from or may include one or more of platinum, palladium, iridium, a Pt/Ir alloy, gold, silver, titanium, rhenium, copper, iron, nickel, stainless steel, zirconium, tantalum, molybdenum, niobium, alloys thereof, and the like.

The internally-heated high-pressure apparatus 300 may further comprise a bottom end heater 331 and/or a top end heater 341 that are thermally coupled to the bottom portion and the top portion of capsule 307, respectively. Bottom end heater 331 generates a power distribution that is approximately azimuthally uniform about the axis of heater 305 and the relative power level in bottom end heater 331, relative to the power level in lower heater 305b and upper heater 305a, along with the radial dependence of the power density within bottom end heater 331, is chosen so as to maintain a temperature distribution along bottom surface 215 or, alternatively, along bottom baffle 213, that is uniform within 10 degrees Celsius, within 5 degrees Celsius, within 2 degrees Celsius, or within 1 degree Celsius. In certain embodiments, the relative power level in bottom end heater 331, relative to the power level in lower heater 305b and upper heater 305a, along with the radial dependence of the power density within bottom end heater 331, is chosen so as to maintain an average temperature of bottom surface 215 or, alternatively, of bottom baffle 213, that is equal to the average temperature within a specified height, measured with respect to bottom surface 215, of the inner surface of capsule 307, to within 20 degrees Celsius, within 10 degrees Celsius, within 5 degrees Celsius, within 2 degrees Celsius, or within 1 degree Celsius. In certain embodiments the specified height is approximately 1 centimeter, 5 centimeters, 10 centimeters, 20 centimeters, or 25 centimeters. Top end heater 341, if present, generates a power distribution that is approximately azimuthally uniform about the axis of heater 305 and the relative power level in top end heater 341, relative to the power level in lower heater 305b and upper heater 305a, along with the radial dependence of the power density within top end heater 341, is chosen so as to maintain a temperature distribution along top surface 345 that is uniform within 10 degrees Celsius, within 5 degrees Celsius, within 2 degrees Celsius, or within 1 degree Celsius. In certain embodiments, the relative power level in top end heater 341, relative to the power level in lower heater 305b and upper heater 305a, along with the radial dependence of the power density within top end heater 341, is chosen so as to maintain an average temperature of top surface 345 that is equal to the average temperature within a specified height range, measured with respect to top surface 345, of the inner surface of capsule 307, to within 20 degrees Celsius, within 10 degrees Celsius, within 5 degrees Celsius, within 2 degrees Celsius, or within 1 degree Celsius.

Referring again to FIGS. 1A, 1B, and 1C, the thermodynamic driving force for preferential deposition on the walls, as compared to the seed crystals, can in principle be greatly reduced by significantly reducing the temperature difference between the walls and the seed crystals.

A quantity $T_{max}(z)$ may be defined as the maximum temperature along an inner surface of growth chamber 101 as a function of the height z above bottom surface 215. Similarly, a quantity $T_{min}(z)$ may be defined as the minimum temperature along an inner surface of growth chamber 101 as a function of the height z above bottom surface 215. Under conventional use of growth chambers within high-pressure apparatus such as that illustrated schematically in FIGS. 2 and 3, both $T_{max}(z)$ and $T_{min}(z)$ are lower, on average, by approximately 5 to 50 degrees Celsius, for heights z within upper zone 105 than within lower zone 107. In addition, both $T_{max}(z)$ and $T_{min}(z)$ may be decreasing functions of height within both within upper zone 105 and within lower zone 107, so as to achieve a desirable free convective fluid flow within growth chamber 101. Typically, $T_{max}(z)$ is greater than $T_{min}(z)$ by between 0 and 10 degrees Celsius, between 0 and 5 degrees Celsius, between 0 and 3 degrees Celsius, between 0 and 2 degrees Celsius, or between 0 and 1 degree Celsius. As it may be quite difficult to measure $T_{max}(z)$ and $T_{min}(z)$ directly, their values may be estimated rather accurately by performing a validated computational fluid dynamics (CFD) calculation.

Figures 4A, 4B:
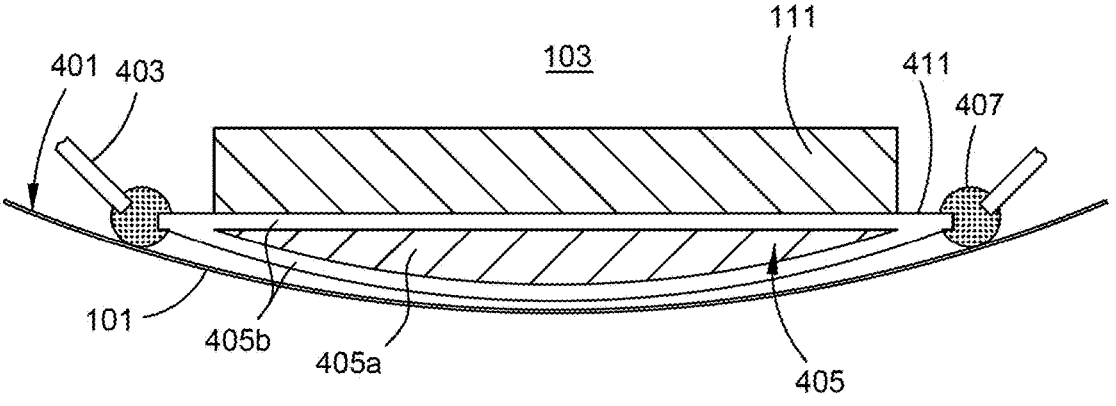
FIG. 4A is a schematic diagram showing a cross section of a growth zone within a high-pressure apparatus according to an embodiment of the current disclosure.
FIG. 4B is a schematic diagram showing a close-up of a perimeter of the growth zone of FIG. 4A, according to an embodiment of the current disclosure.

In certain embodiments, one or more seed crystals are positioned in close proximity to an inner diameter of a capsule, liner, or autoclave, as shown schematically in FIG. 4A. Rather than placing seeds in the middle of growth chamber 101, as in FIGS. 1A, 1B, and 1C, in certain embodiments one or more seed mounts 403 are placed proximate to an inner surface 401 of growth chamber 101, as shown schematically in FIG. 4A. The seed mounts 403 will generally include a surface 411 and a seed mount region 405, which is positioned on a side of the seed mount 403 that is opposite to the surface 411. In some embodiments, as will be discussed further below, the seed mount region 405 can include a seed mount volume 405a that is defined by an inner surface of one or more walls 405b. The seed mount volume 405a can include a sealed volume that includes a solid, liquid, gas, super critical fluid, or evacuated space (e.g., sub-atmospheric pressure containing space). In some cases, the seed mount volume 405a can include a partially sealed volume that includes one or more openings that are in fluid communication with the fluid(s) disposed within the interior volume 103 of the growth chamber 101 during processing. In some other embodiments, the seed mount 403 comprises a solid block of material that includes the surface 411, and seed mount regions 405 are a component of seed mounts 403, with no discrete walls 405b.

During processing, a large-area surface of seed crystals 111 can then be placed in contact with or in close proximity to a surface 411 of the seed mount 403. As noted in U.S. Pat. No. 8,979,999, there may be certain advantages for crystal growth to occur predominantly on just one side of seed crystals 111, for example, a large-area surface facing away from the surface 411 of the seed mount 403.

Figure 5B:
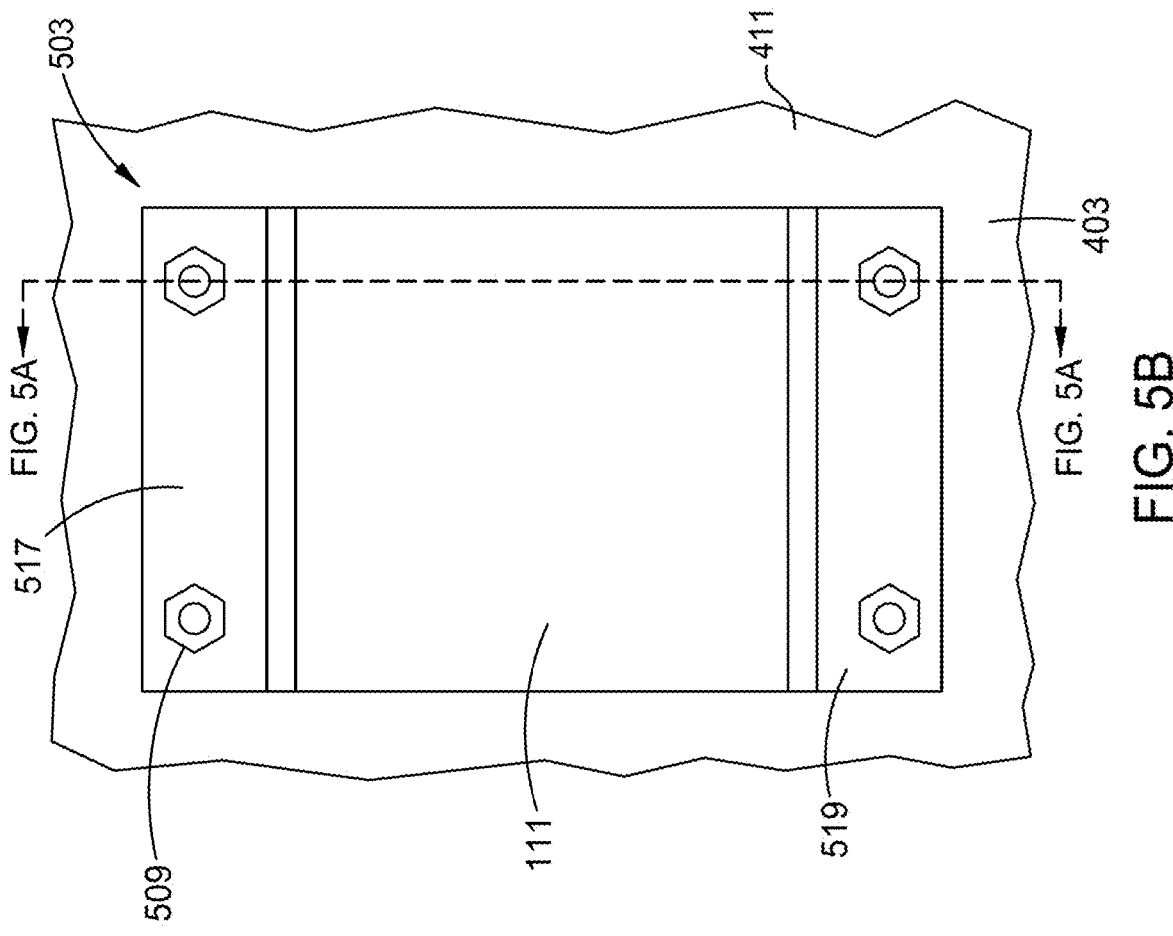
FIGS. 5A and 5B are schematic diagrams showing a method for mounting of seed crystals according to an embodiment of the current disclosure.
Figure 5A:
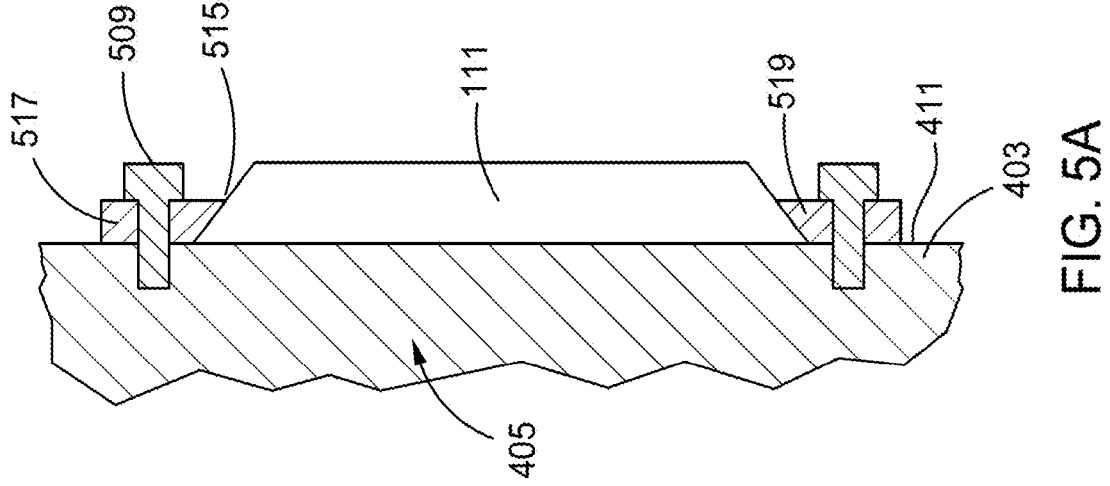

Referring to FIGS. 5A and 5B, in certain embodiments, a back surface of seed crystal 111 is placed against the surface 411 of the seed mount 403. In certain embodiments, one, two, or more edge surfaces 515 of seed crystals 111 are held in place by upper seed brackets 517 and lower seed brackets 519. The terms "upper" and "lower" refer to a common configuration where seed crystals 111 are positioned vertically within growth chamber 101, but other arrangements are possible, for example, where seed crystals 111 are positioned horizontally or in an oblique orientation. In certain embodiments, edge surfaces 515 of seed crystals 111 have a crystallographic orientation within ±3° of {10-10}, {10-1±1}, (0001), or (000-1). In certain embodiments, upper seed brackets 517 and lower seed brackets 519 are attached to a portion of the seed mounts 403 by means of fasteners 509. In certain embodiments, at least one of upper seed bracket 517 or lower seed bracket 519 is attached to the surface 411 of the seed mount 403 by one or more of welding or brazing. In the embodiment illustrated schematically in FIGS. 5A and 5B, seed crystal 111 has a rectangular shape and is held in place by a single lower seed bracket 519 and a single upper seed bracket 517. In other embodiments, seed crystal 111 may have a perimeter that is approximately round, hexagonal, rhombal, triangular, trapezoidal, or the like. Other perimeter shapes are also possible and may be preferred in certain embodiments. In certain embodiments, for example, with hexagonal-shaped seed crystals 111, two bottom edges of seed crystal 111 may rest on two separate lower seed brackets 519, and two upper edges of seed crystal 111 may be held in place by two separate upper seed brackets 517. Additional arrangements are possible, such as additional seed brackets, seed brackets whose edges form a circular section rather than being linear, and the like.

Other methods are possible for positioning seed crystals 111 in contact with or in close proximity to the surface 411 of the seed mounts 403. In certain embodiments, one, two, or more holes are placed in seed crystals 111 and wires or rods that are attached, for example, by welding, are passed through the holes in seed crystals 111. In certain embodiments, one or more clips press at least a portion of seed crystals 111 against the surface 411 of the seed mounts 403. Other arrangements are also possible.

In some embodiments, a back surface of seed crystals 111 is in direct contact with the surface 411 of the seed mount 403, for efficient heat transfer during a crystal growth process. Alternately, in certain embodiments, the seed crystal is positioned proximate to the surface 411 of the seed mount 403. In this case, a gap between a back surface of a seed crystal 111 and a surface 411 of the seed mount 403 is present, with the gap being less than about 5 millimeters, less than about 2 millimeters, less than about 1 millimeter, less than about 0.3 millimeters, less than about 0.1 millimeters, less than about 50 micrometers, or less than about 25 micrometers. In some embodiments, the gap is between about 25 micrometers and about 5 millimeters (mm), such as between about 50 micrometers and about 3 mm, or between about 0.1 mm and about 2 mm. In certain embodiments, an average temperature of a back surface of a seed crystal 111, and a temperature of the surface 411 of the seed mount 403 at a height z, measured from bottom surface 215, may be within about 10 degrees Celsius, within about 5 degrees Celsius, within about 3 degrees Celsius, within about 2 degrees Celsius, or within about 1 degree Celsius, of $T_{max}$ (z).

The materials of construction of seed mounts 403, upper brackets 517, lower brackets 519, and fasteners 509 may include one or more of platinum, palladium, iridium, a Pt/Ir alloy, gold, silver, titanium, rhenium, copper, iron, nickel, stainless steel, zirconium, tantalum, molybdenum, niobium, alloys thereof, and the like.

Referring again to FIG. 4A, in certain embodiments seed mount regions 405 between the backside of the seed mounts 403 and the inner surface 401 of the growth chamber 101 are formed from a solid material. In certain embodiments, the solid material of the seed mounts 403 and/or seed mount regions 405 include or consist of a heat transfer medium material having a thermal conductivity at room temperature above about 50 W/m-K, above about 100 W/m-K, above about 200 W/m-K, above about 300 W/m-K, or above about 400 W/m-K. In certain embodiments, the solid material of the seed mount regions 405 include or consist of one or more of silver, copper, gold, aluminum, beryllium, diamond, cubic boron nitride, beryllium oxide, or aluminum nitride. In certain embodiments, as noted above, the walls 405b and seed mount volume 405a of the seed mount regions 405 include or consist of the same material(s). In certain embodiments, the walls 405b and seed mount volume 405a of the seed mount region 405 of the seed mounts 403 together constitute a monolithic part, which may be fabricated by one or more of machining, electric-discharge machining (EDM), water-jet cutting, laser cutting, grinding, rolling, pressing, forging, or by other methods that are known in the art. In certain embodiments, a gap between seed mounts 403, seed mount regions 405, or a wall 405b defining seed mount regions 405, and inner surface 401 is less than about 5 millimeters, less than about 2 millimeters, less than about 1 millimeter, less than about 100 micrometers, less than about 50 micrometers, or less than about 25 micrometers. In certain embodiments, seed mounts 403 and/or seed mount regions 405 are in direct contact with inner surface 401. In certain embodiments, monolithic parts including seed mounts 403 and seed mount regions 405 are attached to inner surface 401 by at least one of welding, brazing, or clamping by a fixture (not shown). In certain embodiments, seed mounts 403 are attached to inner surface 401 by means of spot welding, for example, through post members. In certain embodiments, the post members stand seed mounts 403 off from inner surface 401 by less than 5 millimeters, less than 2 millimeters, or less than 1 millimeter.

In certain embodiments, seed mount volume 405a of the seed mount regions 405 are filled with a supercritical fluid having approximately the same composition as that within interior volume 103, as shown schematically in FIG. 4B. The walls 405b of the seed mounts 403 may include or consist of sheets or plates, perpendicular to the plane of FIGS. 4A and 4B, and their long edges may be placed within slots in seed mount guides 407. In certain embodiments, seed mount guides 407 include or consist of rods, round bar, square bar, rectangular bar, or another mill form that is known in the art. The seed mount guides 407 can be oriented and aligned such that they extend in the z-direction and are configured to support the seed mounts 403 that are disposed within the array 223 of seed mounts 403. The materials of construction of seed mount guides 407 may be the same as, or different from, the materials of construction of seed mounts 403. In certain embodiments, adjacent components of the seed mounts 403 are instead joined by bending of a wider sheet, plate, or foil, of metal, by welding, by interlacing of "finger" members, or the like. In some embodiments, supercritical fluid in the volumes defined by seed mount regions 405 are "dead", in the sense that it may not exchange readily with supercritical fluid in the balance of interior region 103. In some cases, the enclosed seed mount regions 405, which are defined by the one or more walls 405b, may not be leak tight, with respect to interior region 103, so as to avoid pressure differentials that might otherwise deform seed mounts 403 during processing. However, the fluid conductance of any openings, such as orifices, holes, crevices, slots, or other leak paths between the seed mount volume 405a of the seed mount regions 405 and interior region 103 may be sufficiently small that fluid exchange between the seed mount volume 405a and interior region 103 is sufficiently slow as to not significantly impact heat flow between the regions or the temperature distributions within the regions. In a specific embodiment, the open area of the openings present in the walls 405b, which are disposed between seed mount regions 405 and interior region 103, is expressed as a percentage of a cross-sectional area of growth chamber 101, is less than about 5%, less than about 2%, less than about 1%, less than about 0.5%, or less than about 0.25%. As a consequence, supercritical fluid within the seed mount volume 405a of the seed mount regions 405 can be a very effective heat transfer medium and can ensure that the temperature of surface 411 of the seed mounts 403 at any a height in the z-direction, expressed with respect to bottom surface 215, are equal, to within 2 degrees Celsius, within 1 degree Celsius, within 0.5 degrees Celsius, or within 0.2 degrees Celsius, of $T_{max}$(z). The upper and lower ends of the seed mount volume 405a may be terminated by baffle plates (not shown), with seed mounts 403 and seed mount guides 407 being slidingly inserted into slots or holes therein. In certain embodiments, at least one of seed mounts 403 and seed mount guides 407 include multiple pieces that are stacked vertically within growth chamber 101. In certain embodiments, seed mounts 403 are attached to inner surface 401 by means of spot welding, for example, through pillar or post members. In certain embodiments, the post members stand a rear surface of the seed mount 403, which is on an opposite side of seed mount 403 from the surface 411, off from the inner surface 401 of the growth chamber 101 by less than 5 millimeters, less than 2 millimeters, or less than 1 millimeter. In certain embodiments, a gap between a rear surface of a wall 405a of the seed mounts 403 and inner surface 401 is mostly closed by means of a "skirt" or "fringe" fabricated from foil, for example.

Referring again to FIG. 4A, in certain embodiments additional seed crystals are placed within central region 409 of interior region 103. In certain embodiments, polycrystalline nutrient is placed within central region 409.

In certain embodiments, the surface 411 of the seed mounts 403 may include openings disposed behind the seed crystals 111, so that a backside surface of a seed crystal 111 may be directly exposed to supercritical fluid within seed mount region 405. This embodiment may be referred to as resembling "stained glass windows" such as may be found in churches or religious buildings, where seed crystals 111 are analogous to colored glass and the perimeters of seed mounts 403 and seed mount supports 407 are analogous to a frame in which the colored glass is held.

Figure 6A:
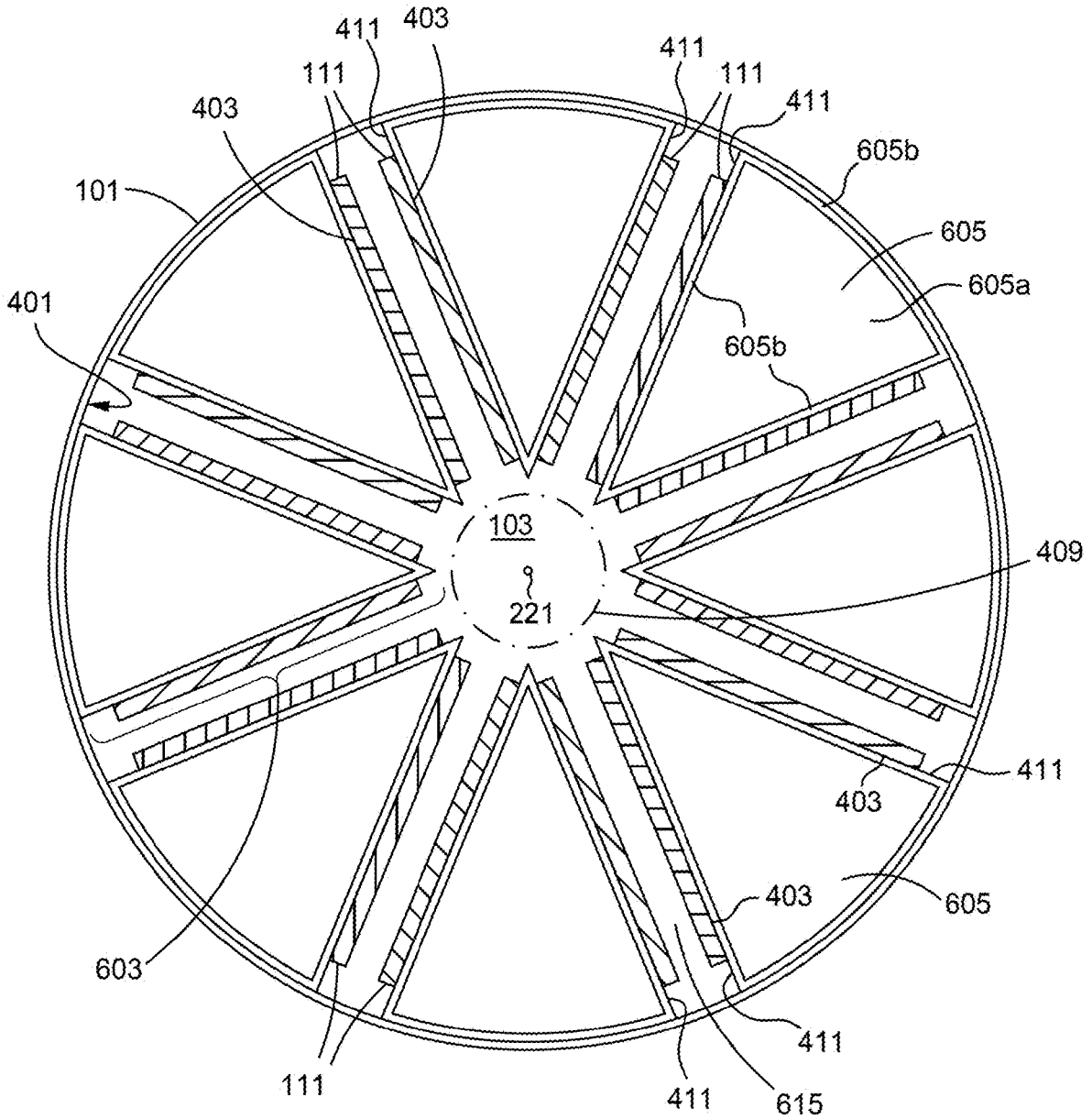
FIG. 6A is a schematic diagram showing a cross section of a growth zone within a high-pressure apparatus according to another embodiment of the current disclosure.
Figure 6B:
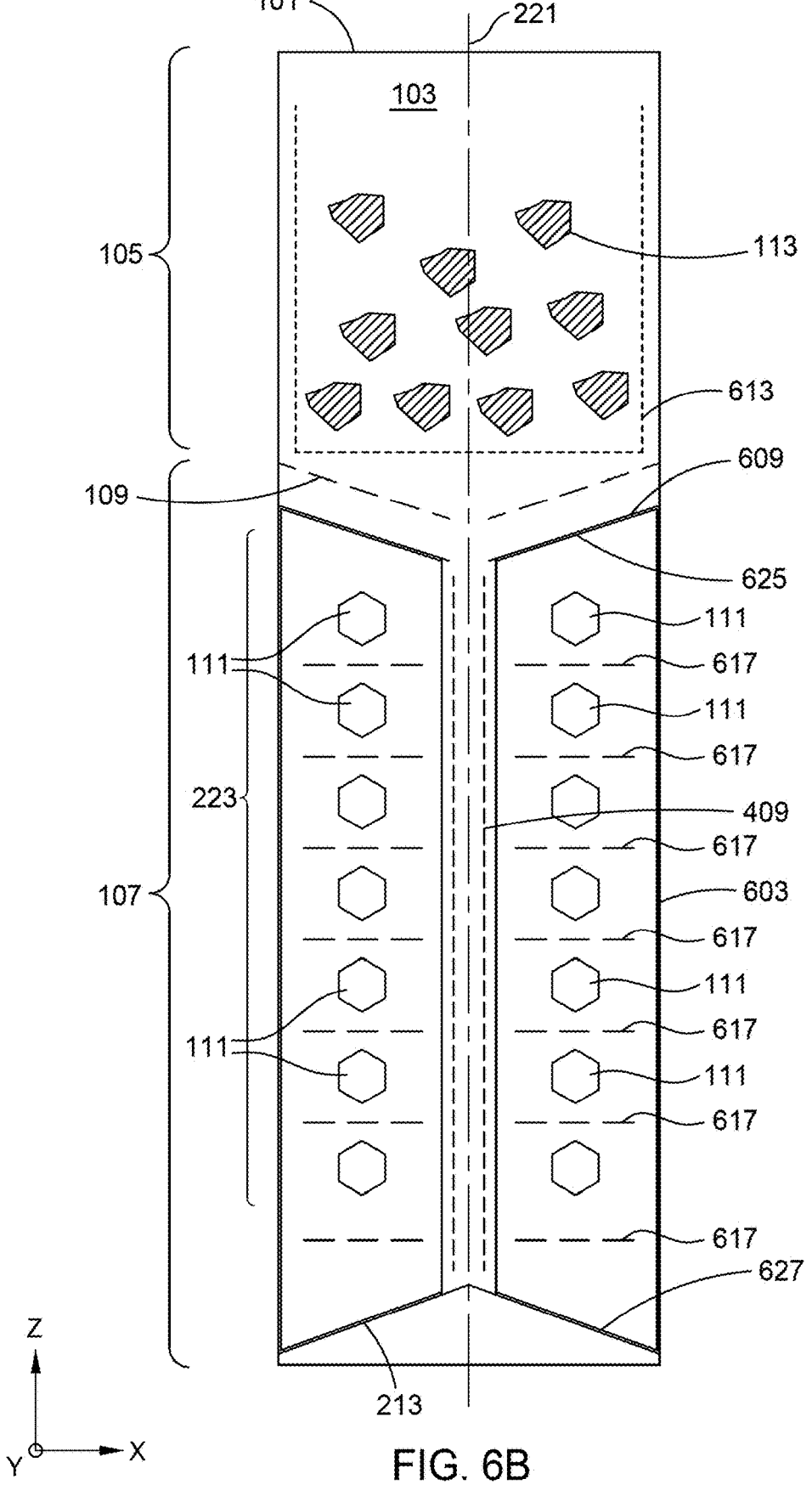
FIG. 6B is a schematic diagram showing an axial view of the growth zone shown in FIG. 6A according to an embodiment of the current disclosure.

In certain embodiments, the seed-facing surfaces 411 of the seed mounts 403 are positioned further away from inner surface 401 than the embodiments illustrated schematically in FIGS. 4A and 4B. FIGS. 6A and 6B illustrate an embodiment where the surfaces 411 of the seed mounts 403, formed on each of a plurality of plurality of wedge-fin members 603, are configured to face each other. A cylindrically-shaped surface of wedge-fin members 603 is placed in direct contact or in close proximity to inner surface 401, for example, with an annular radial gap being less than about 5 millimeters, less than about 2 millimeters, less than about 1 millimeter, less than about 0.3 millimeters, less than about 0.1 millimeters, less than about 50 micrometers, or less than about 25 micrometers. In certain embodiments, wedge-fin members 603 include solid blocks of material. In some embodiments, wedge-fin regions 605 can each include a seed mount volume 605a that is defined by an inner surface of one or more walls 605b. The seed mount volume 605a are filled with a supercritical fluid having approximately the same composition as that within interior volume 103, as shown schematically in FIG. 6A. The seed mount volume 605a of the wedge-fin regions 605 may not be leak tight, with respect to interior region 103, so as to avoid pressure differentials that might otherwise deform seed mounts 403, but the fluid conductance of any orifices, crevices, slots, or other leak paths between the seed mount volume 605a of the wedge-fin regions 605 and interior region 103 may be sufficiently small that fluid exchange between seed mount volume 605a of the wedge-fin regions 605 and interior region 103 is sufficiently slow as to not significantly impact heat flow between the regions or the temperature distributions within the regions. In a specific embodiment, the open area formed between the seed mount volume 605a of the wedge-fin regions 605 and interior region 103, as expressed as a percentage of a cross-sectional area of growth chamber 101, is less than 5%, less than 2%, less than 1%, less than 0.5%, or less than 0.25%. As a consequence, supercritical fluid within the seed mount volume 605a of the wedge-fin regions 605 can be a very effective heat transfer medium and can ensure that the temperature of the surface 411 of the seed mounts 403 at a given height in the z-direction, expressed with respect to bottom surface 215, are equal to $T_{max}(z)$, to within about 10 degrees Celsius, to within about 5 degrees Celsius, to within about 3 degrees Celsius, to within about 2 degrees Celsius, to within about 1 degree Celsius, or to within about 0.5 degrees Celsius.

The upper surface 625 and lower surface 627 of wedge-fin members 603 may have a conical shape, as shown schematically in FIG. 6B. Lower surface 627 may rest on a bottom baffle 213, which may have a conical shape, so that the weight of wedge-fin members 603 causes the latter to be pushed outward against inner surface 401 of growth chamber 101. Polycrystalline nutrient 113 may be placed in a nutrient basket 613, which may be axially supported on one or more baffles 109 and baffle support 609. Baffle support 609 may have a conical shape that mates with upper surface 625, so that the weight of baffle 109, nutrient basket 613, and polycrystalline nutrient 113 cause wedge-fin members 603 to be pushed outward against inner surface 401 of growth chamber 101. One or more baffles 109 may also have a conical shape, to encourage supercritical fluid within interior region 103 to flow downward from baffle 109 through central region 409 of interior region 103 and then upward though vertical channels 615 (FIG. 6A) formed between adjacent wedge-fin members 603 on which the seed crystals 111 are disposed.

In certain embodiments, one or more additional horizontal baffles 617 are placed within the seed mount volume 605a of the wedge-fin regions 605 to enable controlled temperature gradients within wedge-fin regions 605. In certain embodiments, the axial spacing between adjacent horizontal baffles 617 is between about 10 millimeters and about 500 millimeters or between about 25 millimeters and about 250 millimeters. The percent open area of horizontal baffles 617, with respect to a horizontal cross section of wedge-fin regions 605, may be between about 0.5% and about 20% or between about 1% and about 10%. The presence of an axially-spaced array of horizontal baffles 617 may cause formation of localized eddy flows within the supercritical fluid within wedge-fin regions 605, enabling maintenance of small axial temperature gradients. The seed mount volume 605a of the wedge fin regions 605 may also have one or several internal solid ties, joists or connecting members to help modulate temperature distributions or provide structural support in key areas.

The example shown schematically in FIG. 6A has 8 wedge-fin members 603, which include a cylindrical wedge cross-section in the x-y directions and a height in the z-direction. Alternative configurations, for example, with 2, 3, 4, 6, 10, 12, 16, or more wedge-fin members 603 are also possible. In the example shown schematically in FIG. 6A, opposing surfaces 411 of the seed mounts 403 positioned on opposing sides of the vertical channels 615 are approximately parallel, with a constant channel width. Alternative configurations, where the spacing between opposing surfaces 411 of seed mounts 403 increases as the radial distance from the central axis 221 of chamber 101 increases or, conversely, where the spacing between opposing surfaces of seed mounts 403 decreases as the radial distance from the central axis 221 of chamber 101 increases, are also possible and within the scope of the present disclosure.

Figure 7A:
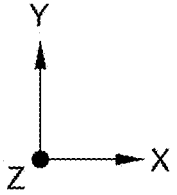
FIGS. 7A and 7B are schematic diagrams showing a cross section of a growth zone within a high-pressure apparatus according to still another embodiment of the current disclosure.
Figure 7B:
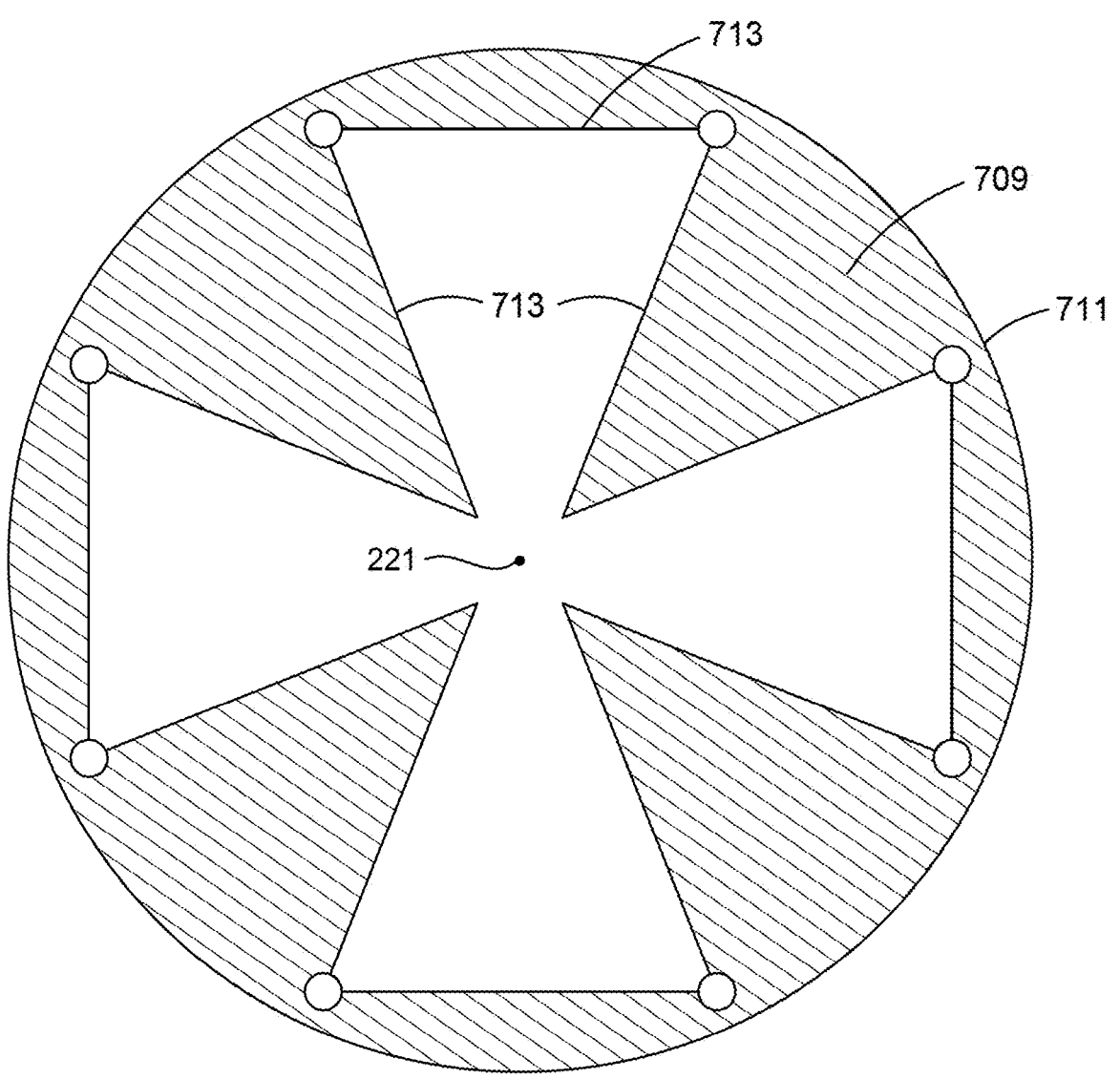

In another set of embodiments, seed mounts 403 are spatially separated from the inner surface 401 of growth chamber 101 but are maintained at a very close temperature during processing via internal heat convection within the seed mount volume 405a of the seed mount region 405. An example of such a configuration is shown schematically in FIGS. 7A and 7B. In certain embodiments, vertical channels 715 between two, three, or more seed mounts 403 are arranged approximately symmetrically around the central axis 221 of the growth chamber 101. As shown in FIG. 7A, the surfaces 411 of the seed mounts 403 are all aligned at an angle formed within the x-y plane to each other, such as, for example, at an angle of approximately 60° to each other.

In the example shown in FIG. 7A, four vertical channels 715 are present, but other configurations, for example, with 2, 3, 5, 6, 8, 10, 12, or more vertical channels are also possible and within the scope of the present disclosure. As in the embodiment shown schematically in FIGS. 4A and 4B, seed mounts 403 may include or consist of sheets or plates, perpendicular to the x-y plane of FIG. 7A, and their long edges may be placed within slots in seed mount guides 407. In certain embodiments, seed mount guides 407 include or consist of rods, round bar, square bar, rectangular bar, or another mill form that is known in the art. The upper and lower surfaces of seed mount region 405, which are disposed a distance apart in the z-direction, may be defined by closure members 709, as shown schematically in FIG. 7B. The inner wall 705b, the inner surface 401 of growth chamber 101 and closure members 709, which are disposed on opposing ends of the inner walls, can be used to at least partially enclose a seed mount volume 705a. Closure members 709 may have holes or openings 711, through which the ends of seed mount guides 407 may be fed, holding seed mount guides 407 in good alignment and holding seed mounts 403 in fixed positions. In certain embodiments, the ends of seed mount guides 407 are threaded, and fasteners such as nuts serve to keep closure members 709 tightly clamped against the upper and lower edges of seed mounts 403. Other means for clamping or attaching the upper and lower edges of the seed mounts 403 against closure members 709, for example, welding, are also possible and are within the scope of the present disclosure. In certain embodiments, the outer diameter of closure members 709 fits snugly, for example, with a slip fit, to inner surface 401 of growth chamber 101. In certain embodiments, an annular radial gap is present between the outer edge of the closure members 709 and the inner surface 401 of growth chamber 101. Such an annular radial gap, which may be less than about 10 millimeters, less than about 5 millimeters, less than about 2 millimeters, less than about 1 millimeter, or less than about 0.5 millimeter, may facilitate assembly, for example. In certain embodiments, an annular sealing member, which can have a toroidal shape, is placed within or above the space formed by the annular radial gap, in order to reduce fluid exchange between the seed mount region 405 and the remainder of interior volume 103. In certain embodiments, the annular sealing member includes one or more of wire, radial segments, foil, a "skirt" or "fringe", or the like. In certain embodiments, horizontal baffles are placed within seed mount regions 405, in a similar fashion as that shown schematically in FIG. 6B (e.g., baffles 617), having an axial spacing between about 10 millimeters and about 500 millimeters or between about 25 millimeters and about 250 millimeters. The percent open area of the horizontal baffles, with respect to a horizontal cross section of seed mount regions 405, may be between about 0.5% and about 20% or between about 1% and about 10%. The presence of an axially-spaced array of horizontal baffles may cause formation of localized eddy flows within the supercritical fluid in the seed mount regions, enabling maintenance of small axial temperature gradients. Seed mount regions 405 may not be leak tight, with respect to interior region 103, so as to avoid pressure differentials that might otherwise deform seed mounts 403, but the conductance of any orifices, crevices, slots, or other leak paths between seed mount regions 405 and interior region 103 may be sufficiently small that fluid exchange between seed mount regions 405 and interior region 103 is sufficiently slow as to not significantly impact heat flow between the regions or the temperature distributions within the regions. In a specific embodiment, the open area between seed mount regions 405 and interior region 103, expressed as a percentage of a cross-sectional area of growth chamber 101, is less than 5%, less than 2%, less than 1%, less than 0.5%, or less than 0.25%. As a consequence, supercritical fluid within seed mount regions 405 can be a very effective heat transfer medium and can ensure that the temperature of seed mounts 403 at a height in the z-direction, expressed with respect to bottom surface 215, are equal, to within 2 degrees Celsius, within 1 degree Celsius, within 0.5 degrees Celsius, or within 0.2 degrees Celsius, of $T_{max}(z)$. One or more baffles 109 disposed above the upper closure member 709 may have a conical shape, to encourage supercritical fluid within interior region 103 to flow downward from baffle 109 through central region 409 of interior region 103 and then upward though vertical channels 715 between adjacent wedge-fin members 603 with seed mounts 403.

Figure 7C:
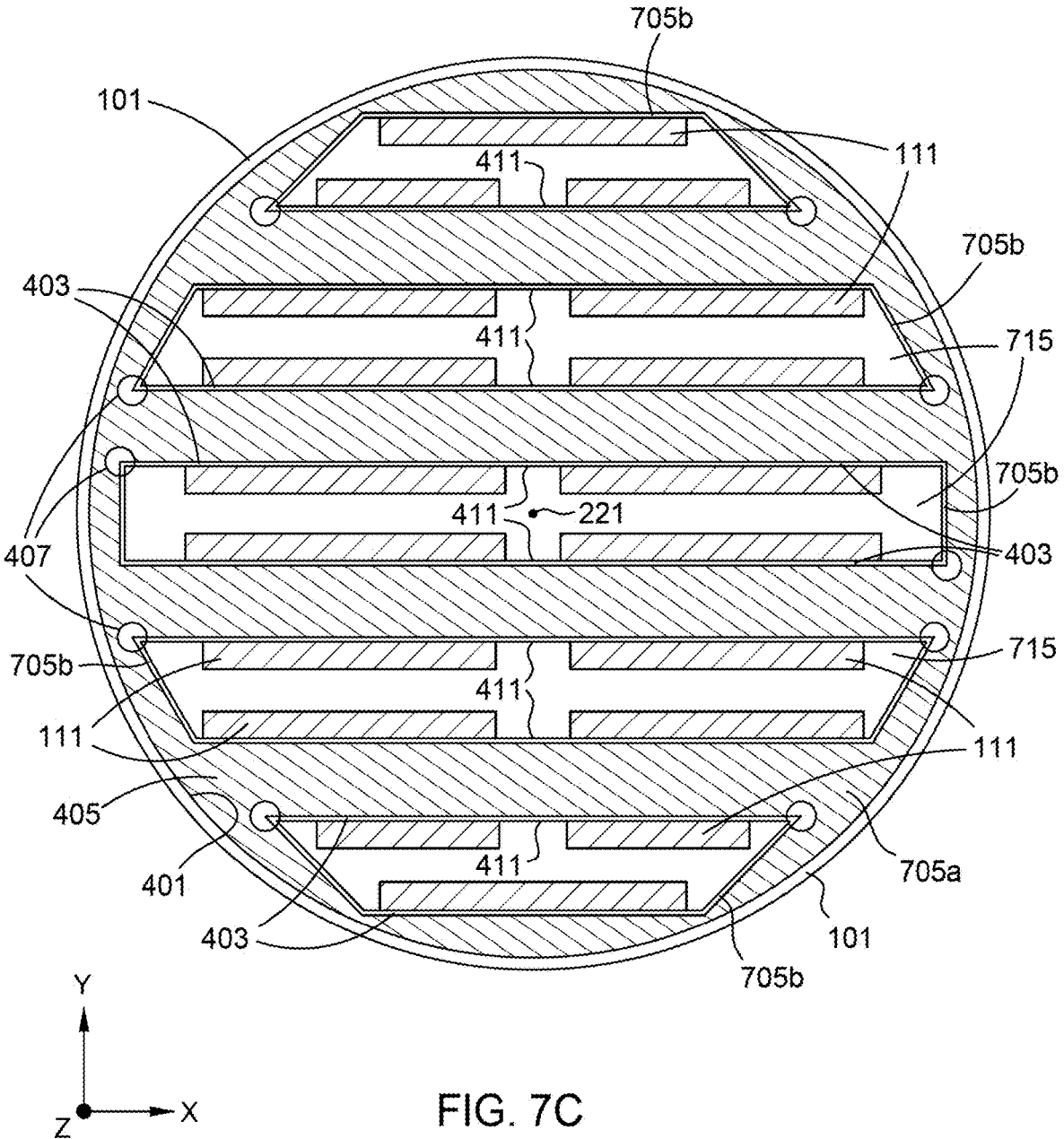
FIGS. 7C and 7D are schematic diagrams showing a cross section of a growth zone within a high-pressure apparatus according to yet another embodiment of the current disclosure.
Figure 7D:
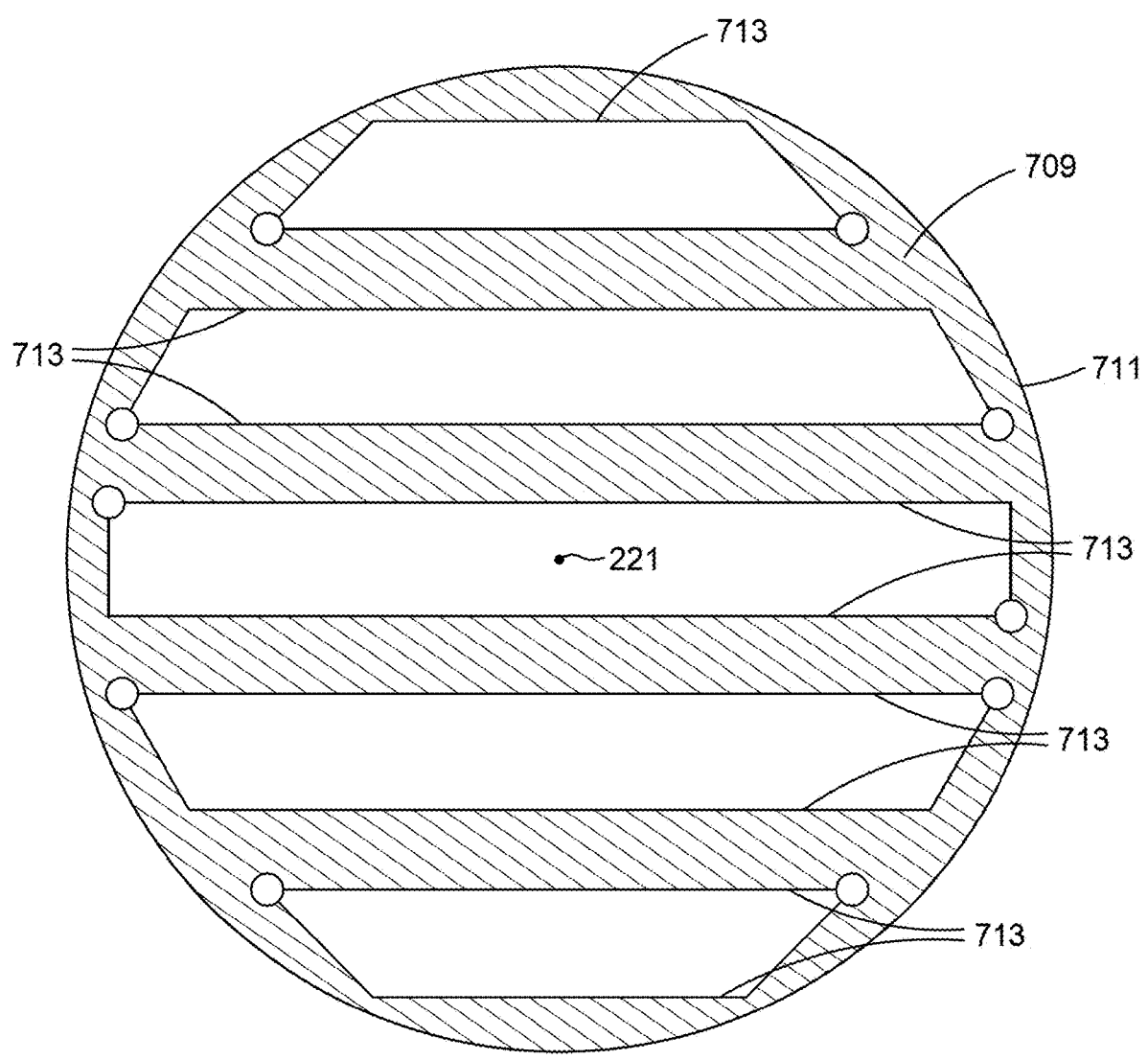

In certain other embodiments, as illustrated in FIGS. 7C-7D, vertical channels 715 that include or consist of seed mounts 403 that are arranged approximately parallel to one another, rather than being arranged symmetrically around the central axis 221 of growth chamber 101. In certain embodiments, the separation between opposing surfaces 411 of the seed mounts 403 within vertical channels 715 may be between about 5 millimeters and about 200 millimeters, between about 10 millimeters and about 150 millimeters, between about 15 millimeters and about 100 millimeters, or between about 20 millimeters and about 75 millimeters. In certain embodiments, the separation between adjacent vertical channels 715 may be between about 1 millimeter and about 100 millimeters, between about 2 millimeters and about 50 millimeters, between about 3 millimeters and about 30 millimeters, or between about 4 millimeters and about 20 millimeters. The upper and lower surfaces of seed mount region 405 may be defined by closure members 709, as shown schematically in FIG. 7D. The inner wall 705b, the inner surface 401 of growth chamber 101, and closure members 709, which are disposed on opposing ends of the inner wall 705b, can be used to at least partially enclose a seed mount volume 705a. Closure members 709 may have holes or openings 711, through which the ends of seed mount guides 407 may be fed, holding seed mount guides 407 in good alignment and holding seed mounts 403 in fixed positions. In certain embodiments, the ends of seed mount guides 407 are threaded, and fasteners such as nuts serve to keep closure members 709 tightly clamped against the upper and lower edges of seed mounts 403. Other means for clamping the upper and lower edges of seed mounts 403 against closure members 709, for example, welding, are also possible and are within the scope of the present disclosure. Seed mount regions 405 may not be leak tight, with respect to interior region 103, so as to avoid pressure differentials that might otherwise deform seed mounts 403, but the fluid conductance of any orifices, crevices, slots, or other leak paths between seed mount regions 405 and interior region 103 may be sufficiently small that fluid exchange between the seed mount volume 705a of the seed mount regions 405 and the vertical channels 715 is sufficiently slow as to not significantly impact heat flow between the regions or the temperature distributions within the regions. In a specific embodiment, the open area, formed between the seed mount volume 705a of the seed mount regions 405 and the interior region 103 of the growth chamber 101, can be expressed as a percentage of a cross-sectional area of growth chamber 101, is less than 5%, less than 2%, less than 1%, less than 0.5%, or less than 0.25%. In certain embodiments, horizontal baffles are placed within seed mount regions 405, in a similar fashion as that shown schematically in FIG. 6B, having an axial spacing between about 10 millimeters and about 500 millimeters or between about 25 millimeters and about 250 millimeters. The percent open area of the horizontal baffles, with respect to a horizontal cross section of seed mount regions 405, may be between about 0.5% and about 20% or between about 1% and about 10%. The presence of an axially-spaced array of horizontal baffles may cause formation of localized eddy flows within the supercritical fluid in the seed mount regions, enabling maintenance of small axial temperature gradients. As a consequence, supercritical fluid within seed mount regions 405 can be a very effective heat transfer medium and can ensure that the temperature of seed mounts 403 at a height z, expressed with respect to bottom surface 215, are equal, to within 2 degrees Celsius, within 1 degree Celsius, within 0.5 degrees Celsius, or within 0.2 degrees Celsius, of $T_{max}(z)$. One or more baffles 109 disposed above upper closure member 709 may have a flat shape. Supercritical fluid within interior region 103 may flow downward from baffle 109 through certain portions of vertical channels 715 and upward though other portions of vertical channels 715, with the regions of down-flow and up-flow varying from one point in time to another.

In the embodiments described above, cooler upper zone 105 within growth chamber 101 is disposed above warmer lower zone 107 (see, for example, FIGS. 1A, 1B, and 1C) and seed mounts 403 at a height in the z-direction, expressed with respect to bottom surface 215, are maintained at temperatures very close to $T_{max}(z)$. In addition, in the embodiments describe above, the difference between $T_{max}$ (z) and $T_{min}(z)$ is quite small, for example, less than about 10 degrees Celsius, less than about 5 degrees Celsius, less than about 2 degrees Celsius, or less than about 1 degree Celsius. However, other configurations are possible.

In certain embodiments, as illustrated in FIGS. 8A-9F, rather than placing polycrystalline nutrient above the growth zone, polycrystalline nutrient is placed at similar lateral positions as the seed crystals and an azimuthal temperature gradient is imposed, so that $T_{max}(z)$ is greater than $T_{min}(z)$ by at least about 3 degrees Celsius, at least about 5 degrees Celsius, at least 7.5 degrees Celsius, at least 10 degrees Celsius, or at least 15 degrees Celsius. In certain embodiments, a non-azimuthally-symmetric temperature distribution is used in conjunction with seed crystals disposed near the inner surface 401 of growth chamber 101, as shown schematically in FIG. 8A. A number of seed mounts 403 may be omitted from at least one azimuthal portion 801 of inner surface 401. A nutrient basket 613 may be placed such that a nutrient volume 805 containing polycrystalline nutrient 113 may be in direct contact with azimuthal portion 801 of inner surface 401. In certain embodiments, nutrient basket 613 may include two or more layers, for example, separated by horizontal baffles (e.g., similar to baffles 617) having an axial spacing between about 10 millimeters and about 500 millimeters or between about 25 millimeters and about 250 millimeters, so as to more precisely control fluid transport between nutrient region 801 and the remainder of interior region 103. In certain embodiments, a lower heater power is applied to azimuthal regions 801, for example, in an internally-heated high-pressure apparatus similar to that shown schematically in FIG. 3, so that $T_{min}(z)$ occurs within azimuthal regions 801 and is less than $T_{max}(z)$ by at least about 5 degrees Celsius, at least 7.5 degrees Celsius, at least 10 degrees Celsius, or at least 15 degrees Celsius. Polycrystalline nutrient 113 may then be etched or dissolved within nutrient region 805 and be transported to seed crystals 111 on seed mounts 403 by free convection and/or by diffusion, for example. In certain embodiments, a non-azimuthally-symmetric temperature distribution is used in conjunction with seed crystals disposed on seed mounts 403 that are portions of wedge-fin members 603, as shown schematically in FIG. 8B. A number of wedge-fin members 603 may be omitted from at least one azimuthal portion 801 of inner surface 401. Other configurations are also possible.

In another set of embodiments, an additional heat source is provided to the interior of growth chamber 101, enabling direct application of heat to seed mounts 403.

Figure 9A:
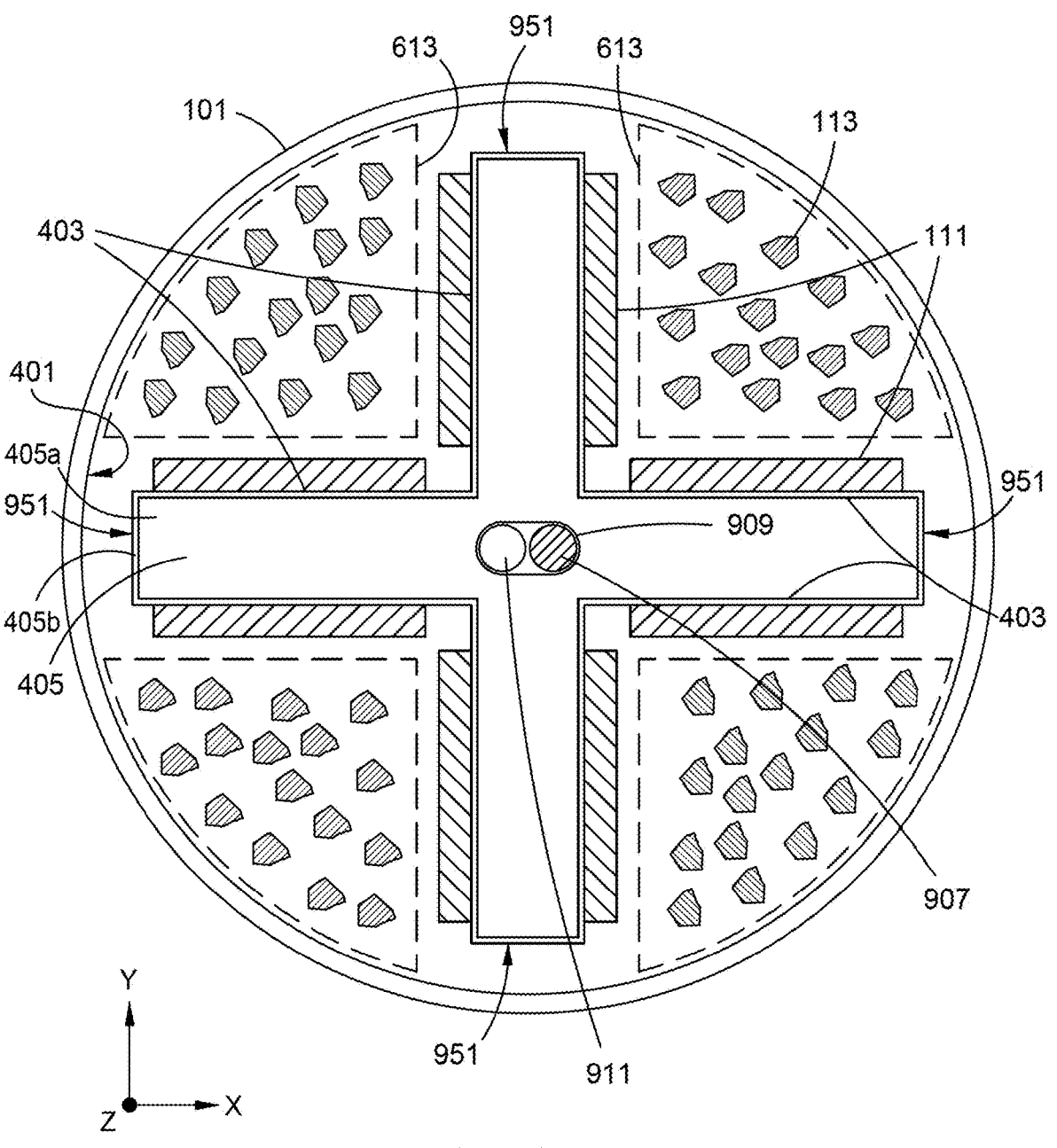
FIGS. 9A and 9B are schematic diagrams showing cross sections of a growth zone within a high-pressure apparatus having an internal heating element according to certain embodiments of the current disclosure.
Figure 9B:
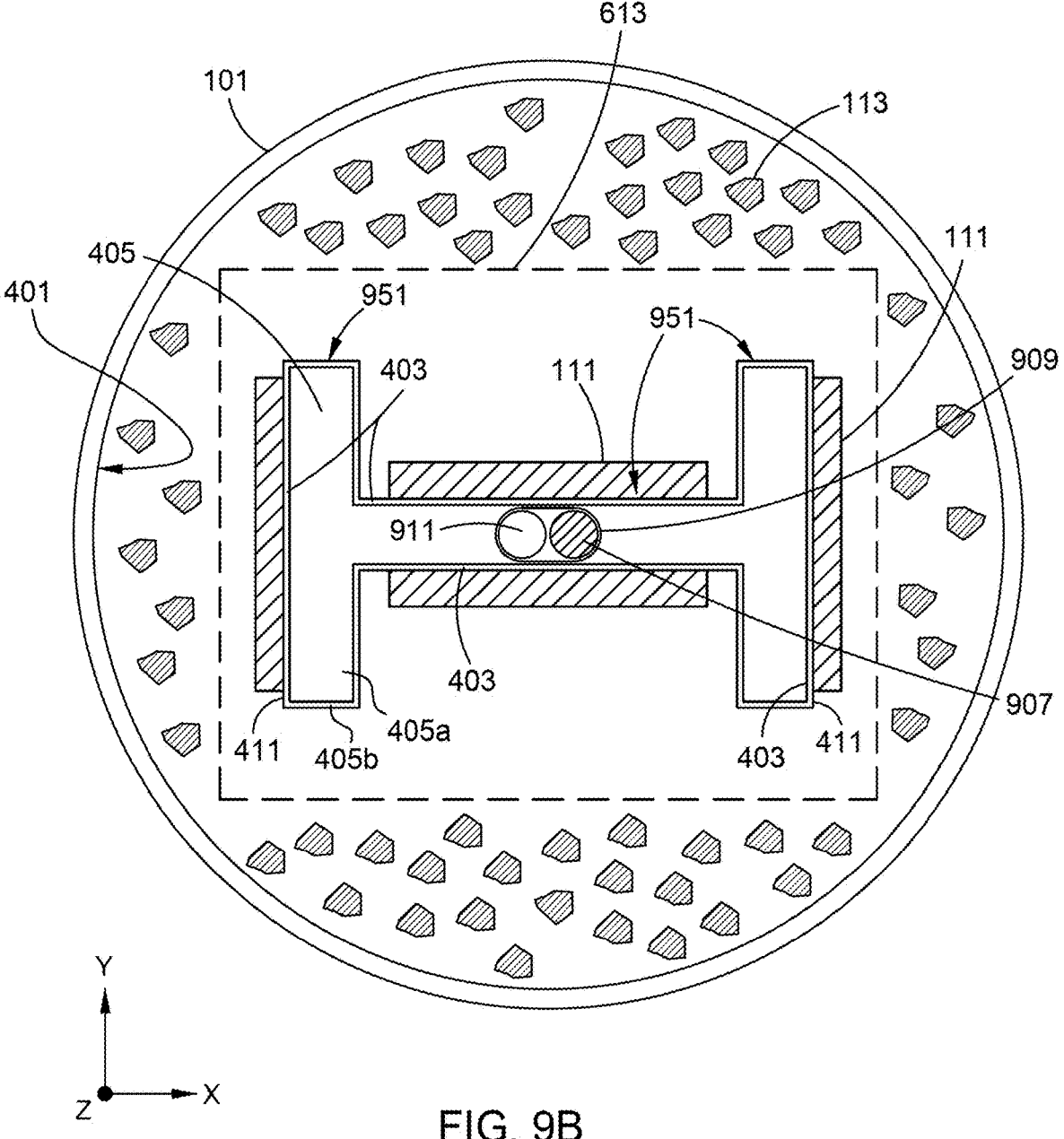

For example, as shown schematically in FIG. 9A, internal heating element 907 may be placed within heater sheath 909 and disposed within an interior portion of growth chamber 101. In certain embodiments, one or more internal heating elements 907 may include or consist of a cartridge heater, a tubular heater, a cable heater, a nickel-chromium wire, a Kanthal A-1™ wire, and a cylindrical ceramic insulating sleeve. In certain embodiments, one or more thermocouples are embedded within internal heating elements 907. In certain embodiments, heater sheath 909 includes or consists of substantially the same composition as inner surface 401 of growth chamber 101. In certain embodiments, heater sheath 909 is hermetically sealed to inner surface 401 of growth chamber 101, for example, by welding, brazing, swaging, or the like. In certain embodiments, the seed mount regions 405 of the seed mounts 403 are vertically-oriented. In the specific embodiment shown schematically in FIG. 9A, seed mounts 403 are formed on four vane members 951 that are arranged symmetrically around a central axis of growth chamber 101. In general, a vane member 951 will include one or more seed mounts 403 that are in thermal communication with the one or more internal heating elements 907. In certain embodiments, the portions of the growth chamber 101 that include internal heating elements 907 may include or consist of two, three, four, five, six, eight, or more vane members arranged symmetrically around a central axis of growth chamber 101. In alternative embodiments, as illustrated schematically in FIGS. 9B and 9D, vane members 951 may be formed from or consist of branched structures that include a plurality of seed mounts 403. In certain embodiments, the vane members 951 include or consist of a monolithic vertical structure, as shown schematically in FIG. 9C. In other embodiments, vane members 951 include or consist of stacked structures, which can be stacked in a desired direction (e.g., z-direction). In certain embodiments, walls bounding or interior materials within the seed mount regions 405 of the seed mounts 403 disposed on the vane members 951 include holes or openings that are slightly larger than a diameter of heater sheath 909, allowing vane members 951 to be slidingly inserted over heater sheath 909 during an assembly process. In certain embodiments, 2, 3, 4, 6, or more internal heating elements 909 are disposed within one or more seed mount regions 403, as shown schematically in FIG. 9D.

In certain embodiments, a seed mount volume 405a, enclosed by a wall 405b, of the seed mount regions 405 of the seed mounts 403 is filled with supercritical ammonia before or during processing. In certain embodiments, horizontal baffles are placed within the seed mount volume 405a of the seed mount regions 405, in a similar fashion as the horizontal baffles 617 shown schematically in FIG. 6B, having an axial spacing between about 10 millimeters and about 500 millimeters or between about 25 millimeters and about 250 millimeters. The percent open area of the horizontal baffles, with respect to a horizontal cross section of seed mount regions 405, may be between about 0.5% and about 20% or between about 1% and about 10%. The presence of an axially-spaced array of horizontal baffles may cause formation of localized eddy flows within the supercritical fluid in the seed mount regions, enabling maintenance of small axial temperature gradients.

In certain embodiments, heater sheath 909 is longer than individual central heating elements 907, necessitating placement of two or more central heating elements 907 one above another. Referring again to FIGS. 9A, 9B, and 9D, in certain embodiments, lead conduits 911 are also placed within heater sheath 909, for example, immediately adjacent to one or more central heating elements 907. Lead conduits 911 may include or consist of one or more of ceramic, glass, glass-ceramic, or metal tubes. In a specific embodiment, lead conduits 911 consist essentially of alumina tubes. One or more electrical leads, thermocouple leads, or the like, from central heating elements 907 may pass through lead conduits 911.

Figure 9C:
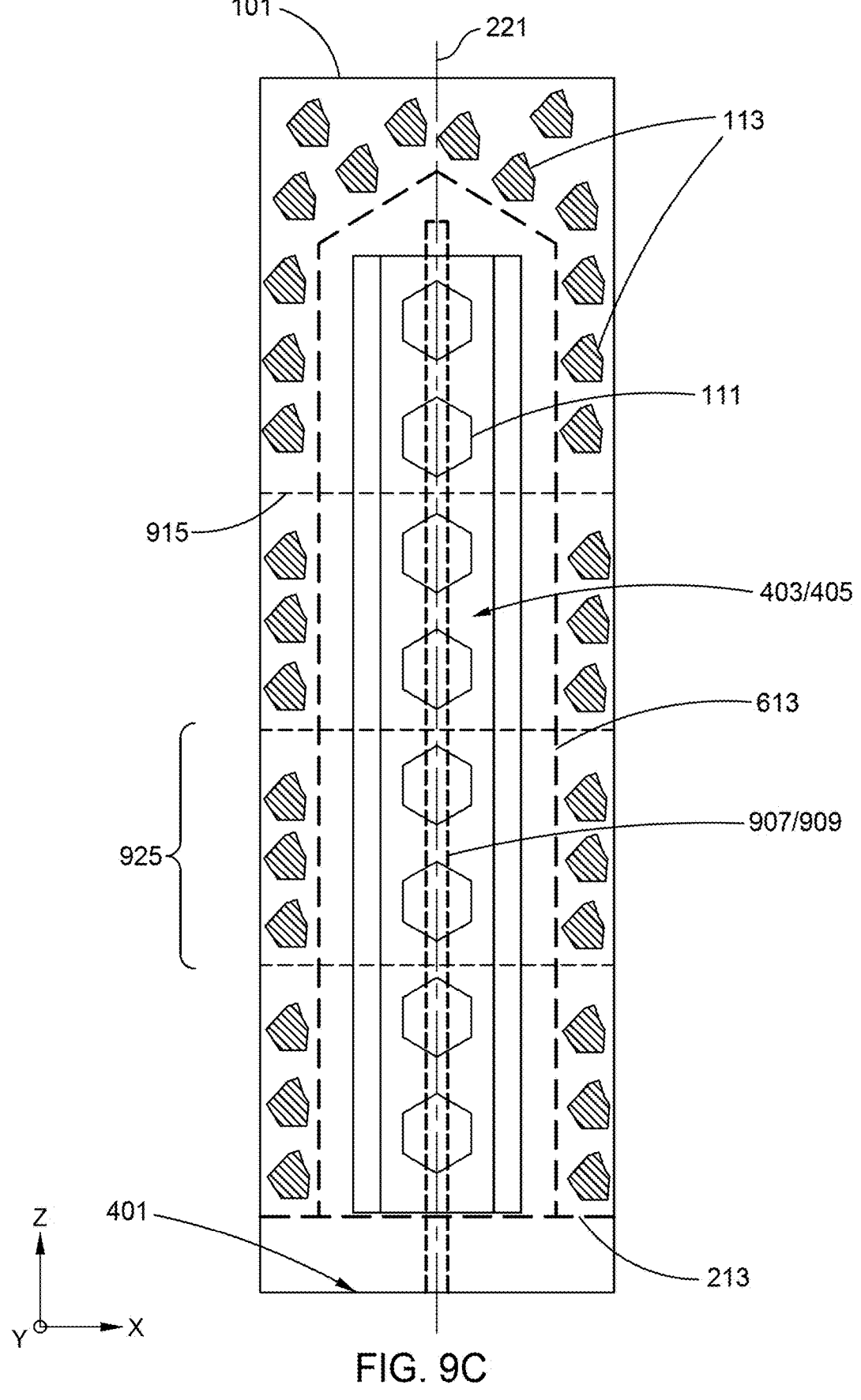
FIG. 9C is a schematic diagram showing an axial view of the growth zone shown in FIG. 9B according to an embodiment of the current disclosure.
Figure 9D:
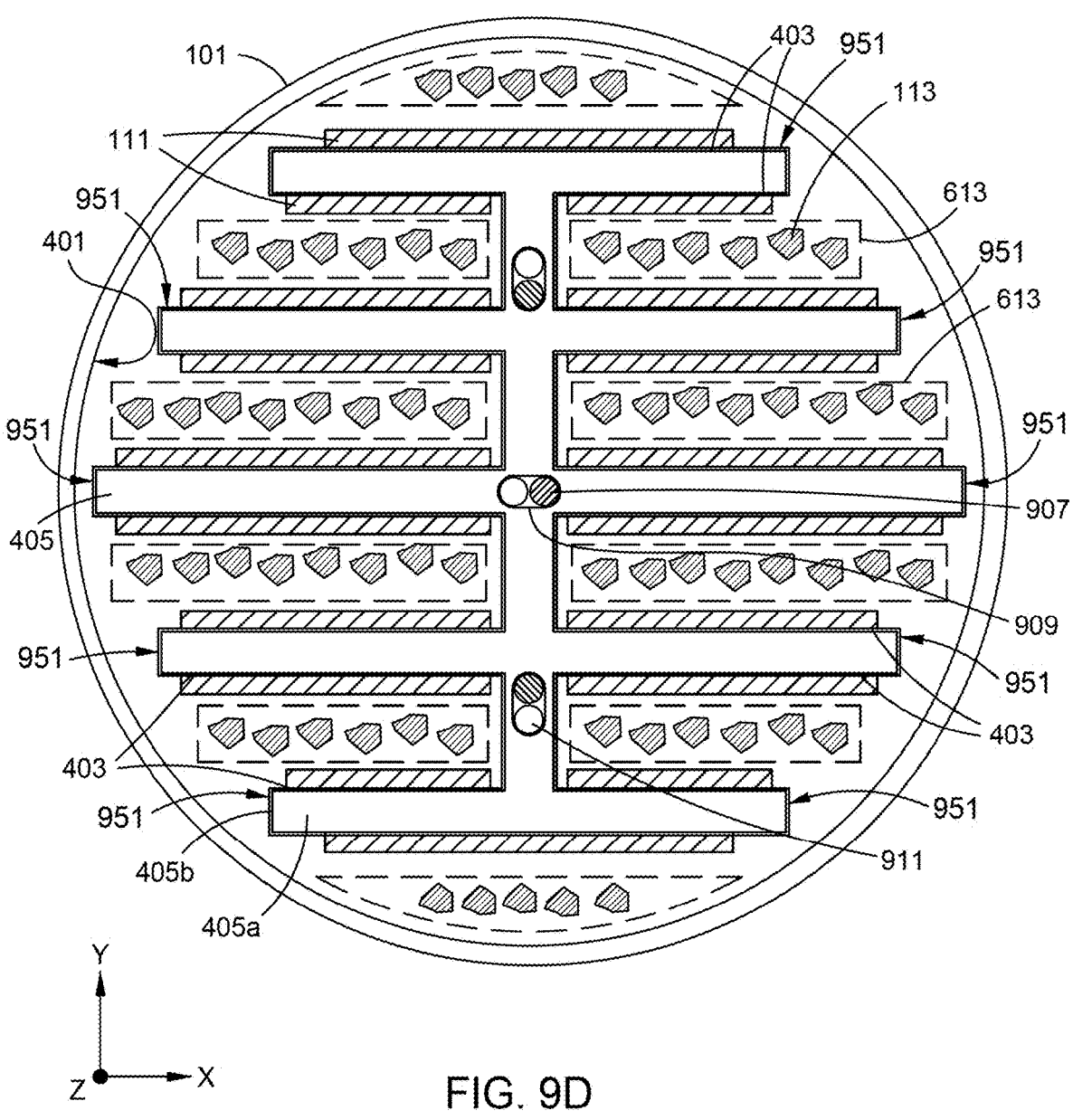
FIG. 9D is a schematic diagram showing a cross section of a growth zone within a high-pressure apparatus having an internal heating element according to yet another embodiment of the current disclosure.

In certain embodiments, heater sheath 909 is attached to a bottom portion of inner surface 401 of growth chamber 101, as shown schematically in FIG. 9C. In other embodiments, heater sheath 909 is attached to an upper end of growth chamber 101. Such an embodiment may be particularly useful when growth chamber 101 is a component of an autoclave, as shown schematically in FIG. 2.

In certain embodiments, heating elements 907 have a serpentine arrangement within the seed mount regions 405, and the seed mount regions 405 include substantially solid material. As discussed above, in some embodiments, the seed mount 403 includes a solid block of material that includes the surface 411, and thus does not include a discrete set of walls 405b.

In certain embodiments, polycrystalline nutrient 113 is placed within one or more nutrient baskets 613 and disposed laterally with respect to seed crystals 111, as shown schematically in FIGS. 9A, 9B, 9C, and 9D, rather than above them, as shown schematically in FIGS. 1A, 1B, 1C, and 6B. Without wishing to be bound by theory, in the case of embodiments with one or more internal heating element as in FIGS. 9A, 9B, 9C, and 9D, the inventors believe that supercritical fluid will flow upward over seed crystals 111, then downward through polycrystalline nutrient 113, when a temperature of seed mount regions 405 and seed mounts 403 at a height z, expressed with respect to bottom surface 215, is greater than $T_{max}(z)$, for example, by between about 1 degree Celsius and about 100 degrees Celsius, by between about 2 degrees Celsius and about 50 degrees Celsius, by between about 3 degrees Celsius and about 25 degrees Celsius, or by between about 4 degrees Celsius and about 15 degrees Celsius. In certain embodiments, diffusion of dissolved nutrient through the supercritical fluid contributes significantly or predominantly to mass transport to seed crystals 111. In some embodiments, the temperatures of the surfaces 411 of the seed mounts 403 at a height in the z-direction are equal to one another, to within 5 degrees Celsius, to within 2 degrees Celsius, to within 1 degree Celsius, or to within 0.5 degrees Celsius.

Referring again to FIG. 9C, in certain embodiments zone separators 915 serve to separate the aforementioned upward and downward flow patterns into discrete zones, rather than enabling flow patterns that rise and fall throughout the entirety of the growth zone 107. In certain embodiments, the materials of construction of the zone separators 915 are the same as those of inner surface 401 of growth chamber 101 or of the seed mounts 403.

In some embodiments, the growth chamber 101 includes at least two zone separators 915, a first zone separator of the at least two zone separators 915 separating a first region of nutrient material (e.g., polycrystalline nutrient 113) from a second region of nutrient material (e.g., polycrystalline nutrient 113) and a second zone separator 915 of the at least two zone separators 915 separating at least one first seed mount 403 from at least one second seed mount 403, and the first and second zone separators, the first nutrient region and the at least one first seed mount forming a growth tier 925 within the interior region 103.

In certain embodiments, zone separators 915 are similar in structure to baffles shown in other embodiments, for example, disks with holes through them. In other embodiments, zone separators 915 consist essentially of solid disks or plates, with a percentage open area with respect to an inner diameter of growth chamber 101 of less than about 15%, less than about 10%, or less than about 5%. In certain embodiments, a clearance between zone separators 915 and seed mounts 403 may be between about 2 millimeters and about 100 millimeters, between about 5 millimeters and about 50 millimeters, or between about 10 millimeters and about 25 millimeters. The presence of a clearance between zone separators 915 and seed mounts 403 may facilitate assembly and/or disassembly. In certain embodiments, zone separators 915 represent the boundaries of tiers that are loaded sequentially into growth chamber 101 over heater sheath 909. For example, in certain embodiments a growth tier 925 may include one or more growth zone separators 915, at least one seed mount region 405, at least one seed crystal 111 mounted on a seed mount 403, a segment of a nutrient basket 113, and polycrystalline nutrient disposed therein. Multiple growth tiers may be stacked axially, for example 2, 3, 4, 5, 10, 20, 30, 50, or more, within growth chamber 101.

Figure 8A:
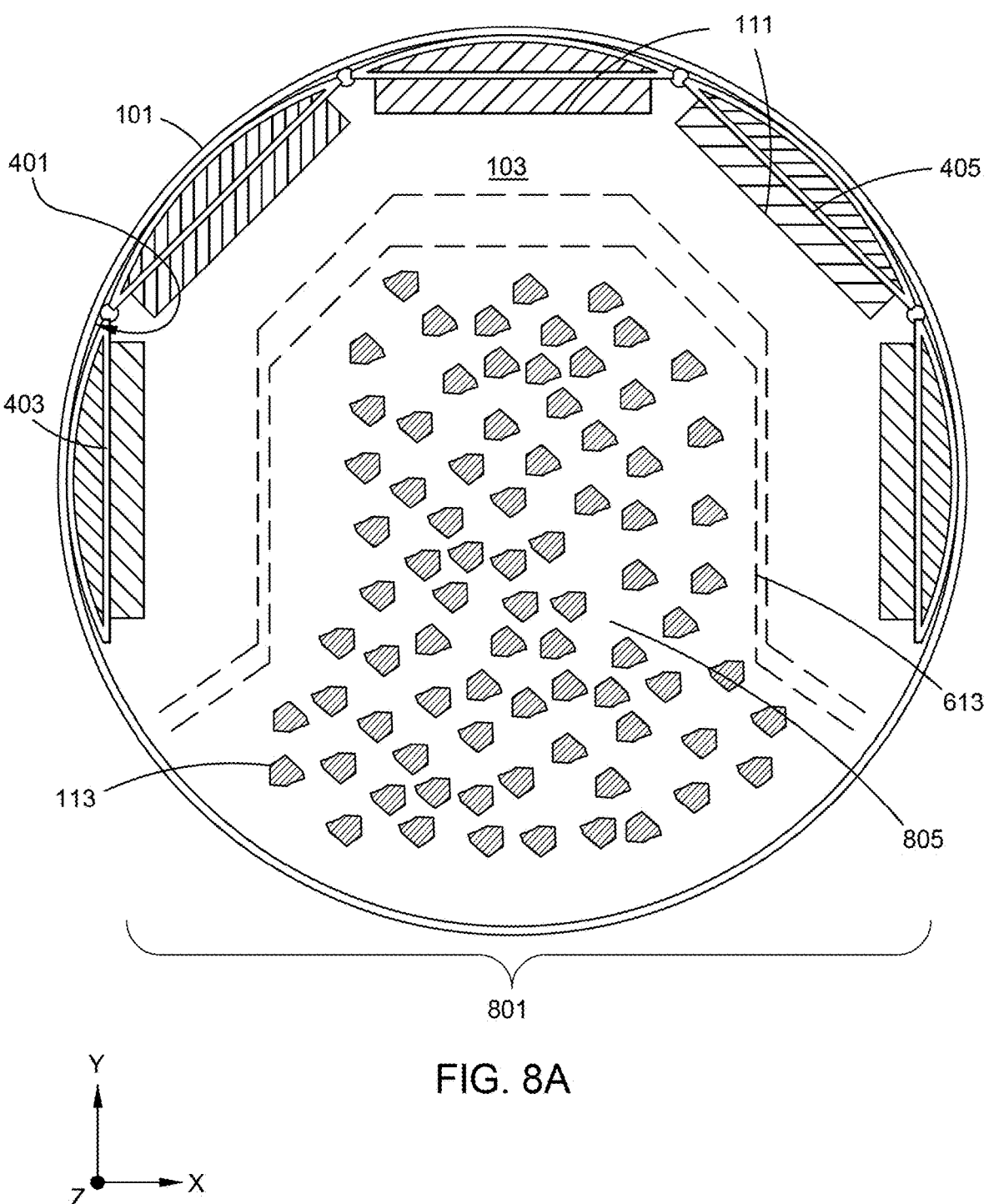
FIGS. 8A and 8B are schematic diagrams showing a cross section of a growth zone and a nutrient zone within a high-pressure apparatus according to additional embodiments of the current disclosure.
Figure 8B:
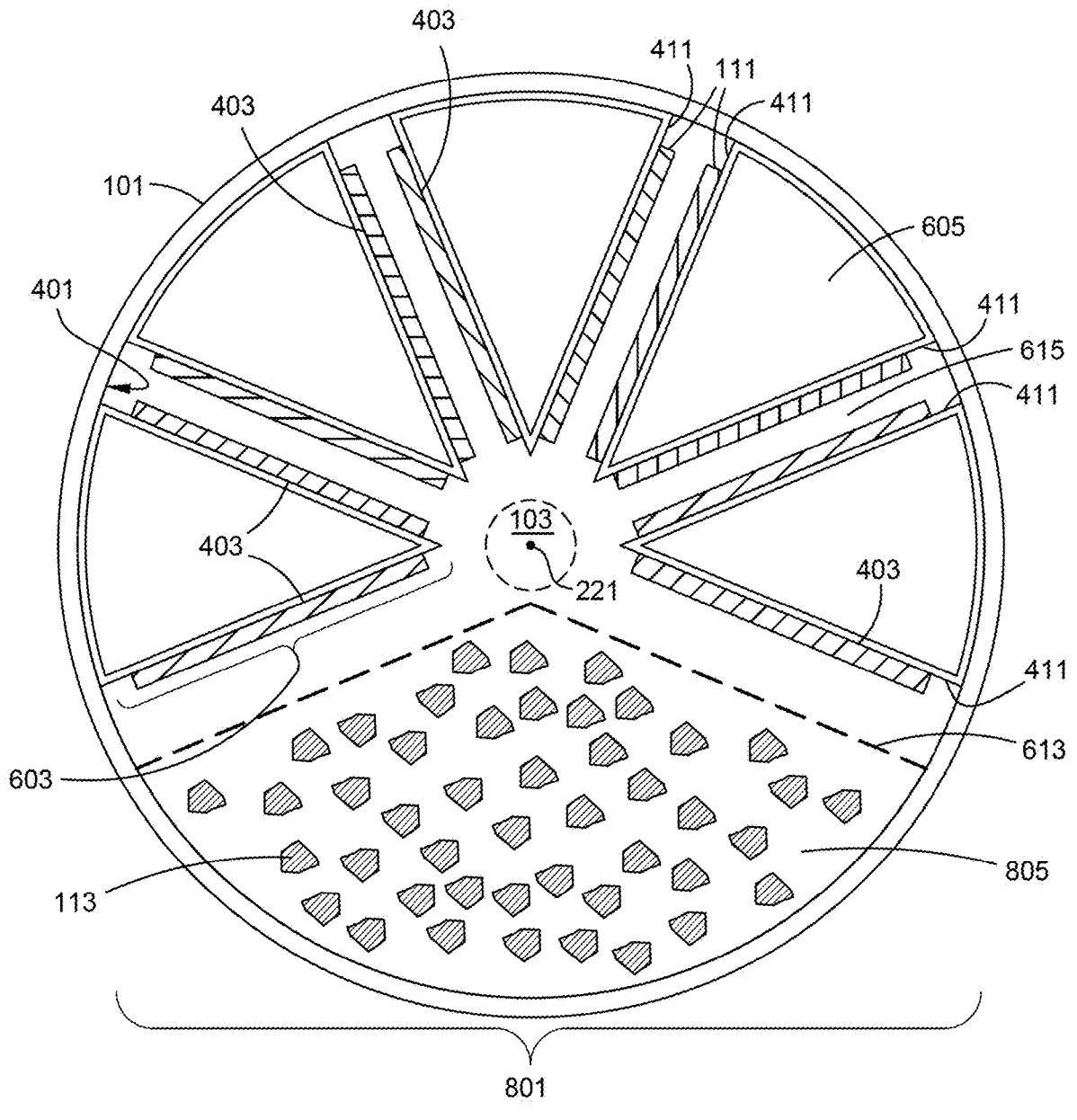

In certain embodiments, zone separators 915 may also be used in conjunction with configurations where $T_{max}(z)$ is configured to be larger than $T_{min}(z)$ along the inner diameter of growth chamber 101, for example, the configurations shown schematically in FIGS. 8A and 8B.

In certain embodiments described above, such as those shown schematically in FIGS. 4A, 6A, 7A, 8A, 8B, 9A, 9B, 9C, and 9D, a maximum diameter of seed crystals 111 is significantly less than an inner diameter of inner surface 401, for example, less than half the diameter of inner surface 401. In other embodiments, a maximum dimension or diameter of seed crystals 111 may approach the value of an inner diameter of inner surface 401, for example, the embodiment shown schematically in FIG. 7C. In the case of the embodiment shown schematically in FIG. 9A, seed crystals 111 having a maximum dimension or diameter approaching that of an inner diameter of inner surface 401 could be accommodated by employing a 2-vane member structure (i.e., a single slab having opposing surfaces 411), rather than a 4-vane member structure. In addition, in the embodiments described above, seed-facing surfaces 411 of seed mounts 403, and large-area surfaces of seeds 111, are generally oriented vertically, that is, substantially parallel to central axis 221.

Figure 9E:
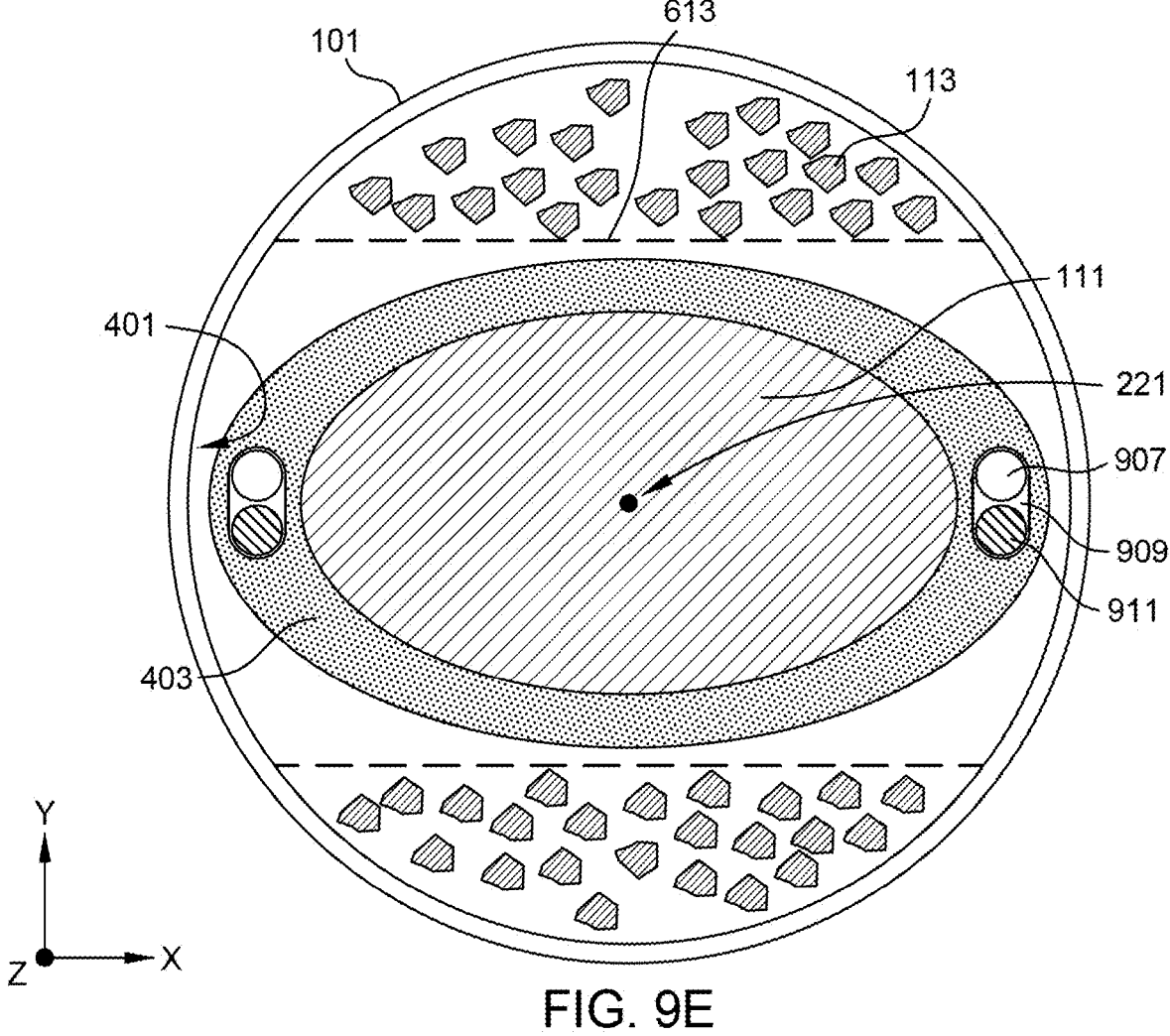
FIG. 9E is a schematic horizontal cross-sectional view of a high-pressure apparatus according to an embodiment of the current disclosure.
Figure 9F:
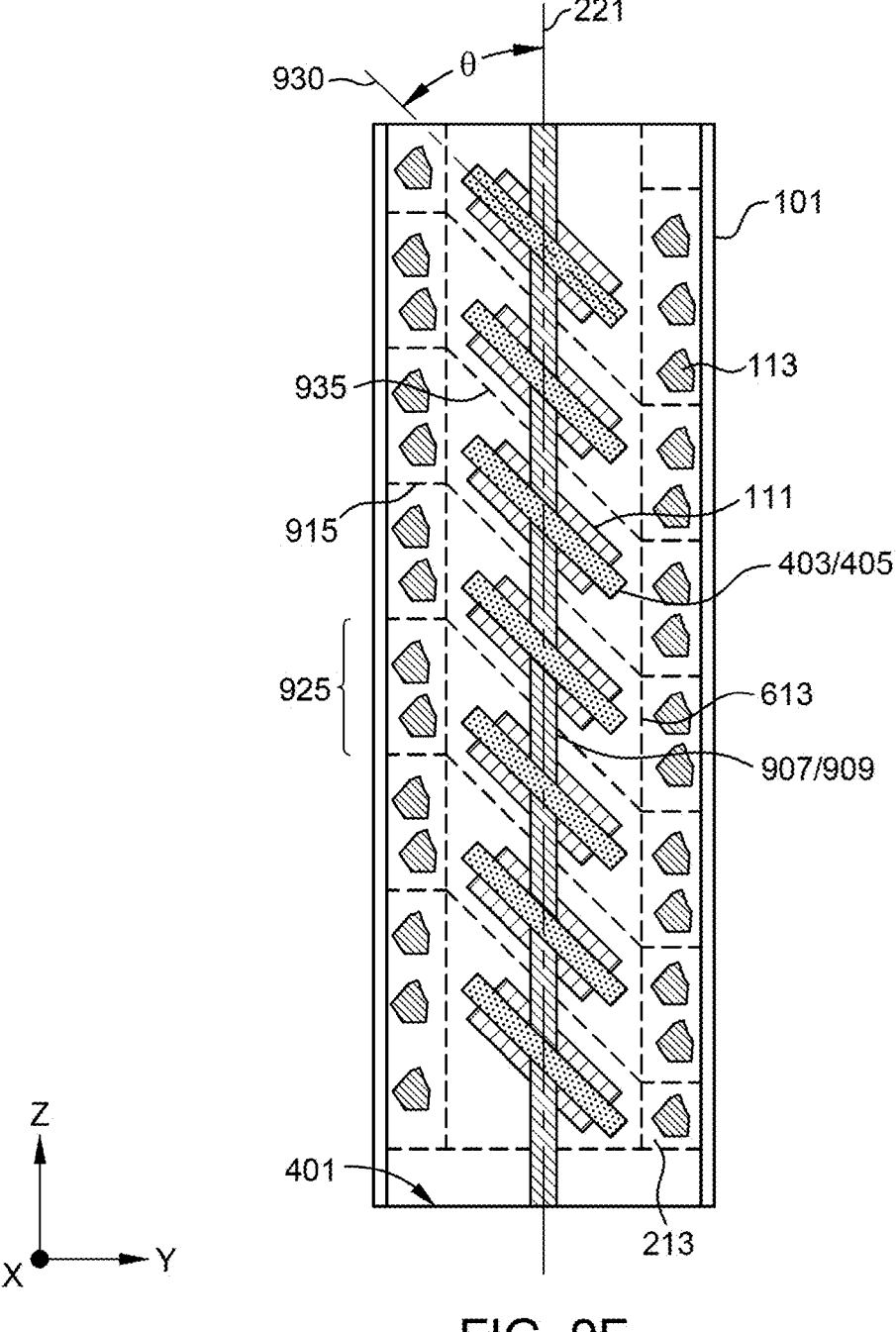
FIG. 9F is a schematic vertical cross-sectional view of a high-pressure apparatus according to an embodiment of the current disclosure.

However, other variations are possible, which are capable of accommodating large numbers of seed crystals 111 having a maximum dimension or diameter that is within 75%, 80%, 85%, 90%, or 95% of a diameter of inner surface 401. In some of these embodiments, for example, as shown schematically in FIGS. 9E and 9F, an angle θ (FIG. 9F) between a plane 930 that is parallel to seed-facing surfaces 411 of seed mounts 403 and central axis 221 has a value between 0 degrees and 90 degrees, between about 20 degrees and about 70 degrees, or between about 30 degrees and about 60 degrees. Referring to FIG. 9E, opposite ends of the seed mounts 403 may be placed in intimate thermal contact with internal heating elements 907. Seed crystals 111 may be mounted on at least one of an upward-facing surface of seed mount 403 and a downward-facing surface of seed mount 403, for example, using seed mount brackets or other means (not shown). FIG. 9E illustrates a schematic top view, where both a seed mount 403 and a seed crystal 111 are tilted by approximately 45 degrees with respect to the plane of the page. Polycrystalline nutrient 113, which is disposed in nutrient baskets 613, may be provided, and positioned a distance from the seed crystals 111. More complex configurations of nutrient baskets 613 are possible, for example, to accommodate increased quantity of nutrient 113 while still maintaining sufficient separation from seed crystals 111 to enable good fluid flow, a sufficient temperature difference for growth rates in the range of 2 to 50 micrometers per hour, and easy assembly/disassembly. Referring to FIG. 9F, axially-adjacent seed mounts 403 (with enclosed or adjoined seed mount regions 405) may be separated from one other by growth baffles 935. In certain embodiments, growth baffles 935 may be tilted from horizontal by an angle within about 10 degrees, within about 5 degrees, or within about 2 degrees of angle θ. Growth baffles 935 may be fabricated from similar materials of construction as one or more of inner surface 401, seed mounts 403 and nutrient baskets 603. Growth baffles 935 may be configured to facilitate free convection of supercritical fluid from local regions of nutrient baskets 603, separated by zone separators 915, around seed crystals 915, and back, with only modest fluid exchange between axially-adjacent regions. The tilt angle θ and the details, such as angle, percent open area, and the like, may be chosen to optimize packing of seed crystals 111, ensuring sufficient nutrient 113, ensuring good growth on both upward-facing and downward-facing seed crystals 111, and easy loading and unloading before and after crystal growth runs.

Crystal Growth Process Examples

Figure 10:
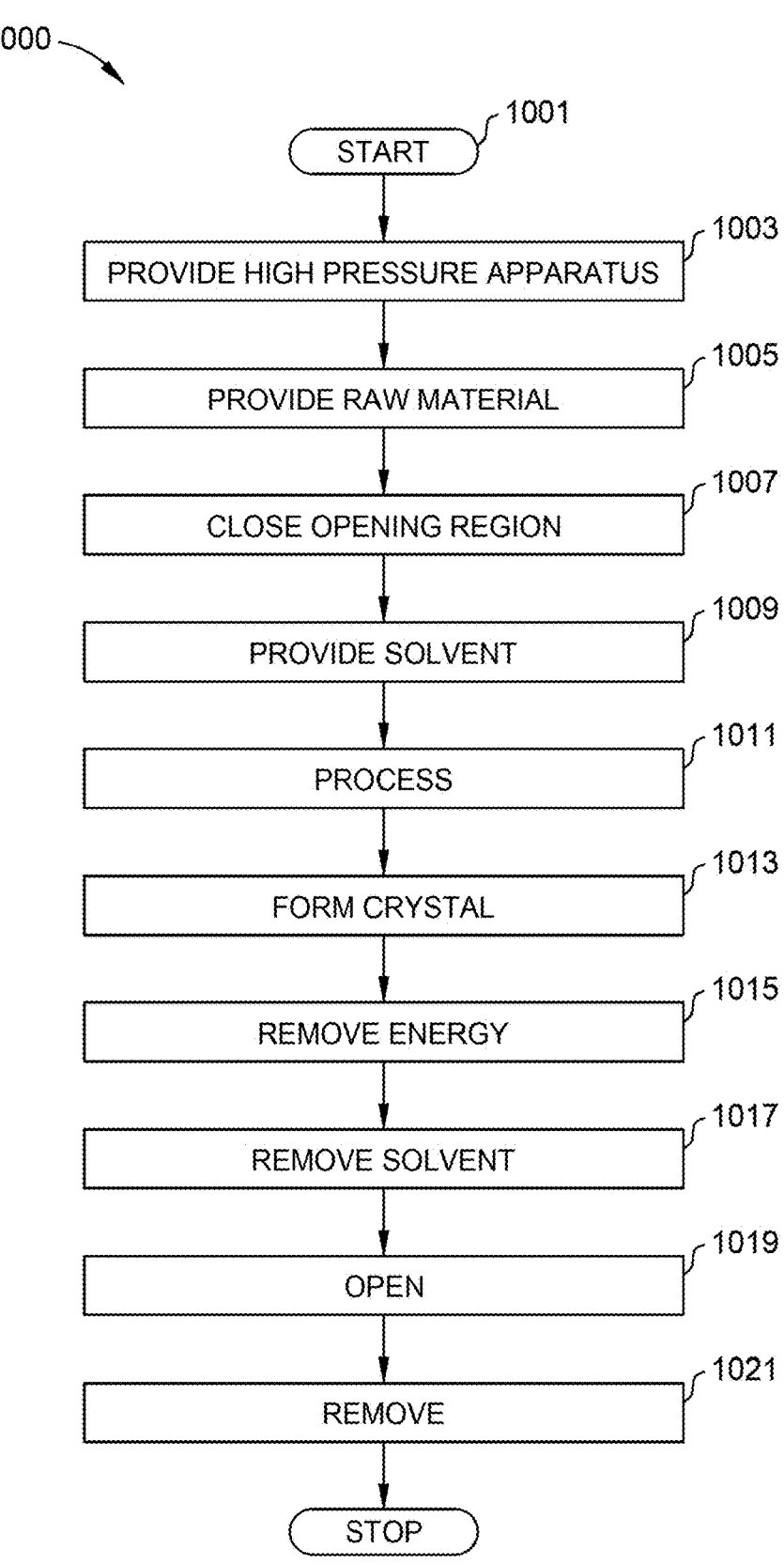
FIG. 10 is a schematic diagram showing a simplified flow diagram of a method of processing a material within a supercritical fluid, according to an embodiment of the present disclosure.

Group III metal nitride single crystals, for example, gallium nitride, may be grown in growth chamber 101 by the following procedure. FIG. 10 is a flowchart illustrating a method 1000 that is used to grow group III metal nitride single crystals. FIG. 10 is a simplified flow diagram 1000 of a method of processing a material within a supercritical fluid. This diagram is merely an example, which should not unduly limit the scope of the claims herein.

In a specific embodiment, the method begins with start, step 1001. The method begins by providing an apparatus for high-pressure crystal or material processing (see step 1003), such as the one described above, but there can be others. In certain embodiments, the apparatus has an interior region (for example, cylindrical in shape) surrounded by radial and axial restraint structures. In certain embodiments, an opening region to the interior region is closable by lid closure or welded structures.

At operation 1005, seed crystals, for example, high-quality single crystal group III metal nitride, may be attached to surfaces 411 of the seed mounts 403 by means of clamps, wires, clips, or the like, as described above. The seed crystals and seed mounts are positioned in the interior region 103 of the growth chamber 101. A polycrystalline nutrient, for example, polycrystalline group III metal nitride, is also added to a basket within the growth chamber 101.

During operation 1005, a solid mineralizer, for example, one or more of an alkali metal such as Li, Na, K, Rb, or Cs, an alkaline earth metal, such as Be, Mg, Ca, Sr, or Ba, or an alkali or alkaline earth hydride, amide, imide, amido-imide, nitride, or azide, an ammonium halide, such as $NH_4F$, $NH_4Cl$, $NH_4Br$, or $NH_4I$, a metal halide, or a compound that may be formed by reaction of one or more of F, Cl, Br, I, HF, HCl, HBr, HI, Ga, Al, In, GaN, AlN, InN, and $NH_3$ with a metal, is also added to growth chamber 101. In a specific embodiment, the raw materials include seed crystals and polycrystalline nutrient material.

At operation 1007, the growth chamber 101 may then be closed, for example, by placement of autoclave cap 217 over autoclave body 201 or by welding an end of capsule 307. Growth chamber 101 may then be evacuated, for example, through a fill tube. Residual air, moisture, and other volatile contaminants may be removed by evacuating growth chamber 101 and heating, for example, using heating elements 205/207 or 305 to a temperature between about 25 degrees Celsius and about 900 degrees Celsius, or between about 100 degrees Celsius and about 500 degrees Celsius, for a time between about 1 hour and about 1000 hours or between about 24 hours and about 250 hours. A plurality of pump/purge cycles may be employed.

At operation 1009, a crystal growth process fluid is provided to the interior region of the growth chamber. In some embodiments, the crystal growth process fluid comprises a mineralizer and a solvent. In some embodiments, the mineralizer includes a gas-phase, liquid-phase, or solid-phase mineralizer. In one embodiment, the mineralizer includes hydrogen halides, such as hydrofluoric acid (HF), hydrochloric acid (HCl), hydrobromic acid (HBr), or hydroiodic acid (HI). In another embodiment, the mineralizer includes a basic composition, such as sodium amide ($NaNH_2$) or potassium amide ($KNH_2$). In certain embodiments, a solvent is added to the internally-heated high-pressure apparatus according to methods that are known in the art. In one specific example, a solvent, such as ammonia, is added into the interior region 103 of the growth chamber 101.

At operation 1011, the growth chamber 101 is then heated to a temperature above about 400 degrees Celsius and pressurized above about 50 megapascal to perform ammonothermal crystal growth. The method includes heating the interior region with thermal energy to cause an increase in temperature within the interior region to greater than 200 degrees Celsius to cause the solvent to be superheated and process the at least one raw material in the interior region.

At operation 1013, in certain embodiments, a temperature of seed mount supports 403 is set to be higher, by a ΔT value between about 1 degree Celsius and about 25 degrees Celsius, between about 2 degrees Celsius and about 20 degrees Celsius, or between about 3 degrees Celsius and about 15 degrees Celsius, than a temperature of a basket supporting polycrystalline nutrient 113. In certain embodiments that include at least one central heating element 907, an average temperature difference between a lower zone 207 or 305b and an upper zone 205 or 305a is less than about 25 degrees Celsius, less than about 20 degrees Celsius, less than about 15 degrees Celsius, less than about 10 degrees Celsius, or less than about 5 degrees Celsius. During the course of a crystal growth run, with a duration between about 24 hours and about 9000 hours, between about 48 hours and about 4000 hours, or between about 96 hours and about 2000 hours, each of a plurality of seed crystals grows into a thick, free-standing ammonothermal group III metal nitride boule.

In certain embodiments, a material efficiency, defined as a net weight gain of seed crystals 111 divided by a quantity defined as the weight loss of polycrystalline nutrient 113 less a weight of nutrient material consumed by a chemical reaction with a mineralizer during the course of a single crystal growth run, is greater than about 50%, greater than about 60%, greater than about 70%, greater than about 80%, greater than about 90%, or greater than about 95%.

During operation 1013, a crystalline material is formed by use of the superheated solvent. In certain embodiments, the crystalline material comprises a gallium-containing nitride crystal such as GaN, AlGaN, InGaN, and others.

In general, after performing operation 1013, operations 1015-1021 are generally performed by performing the steps within operations 1005-1011 in reverse and in a reverse sequential order.

However, in a specific embodiment, during operation 1015, the method removes thermal energy from the capsule to cause a temperature within the interior region 103 to change from a first temperature to a second temperature, which is lower than the first temperature.

At operation 1017, once the energy has been removed and temperature reduced to a suitable level, the method removes a solvent from the interior region.

Next, at operation 1019, in a specific embodiment, the interior region 103 is opened. In cases where operation 1007 includes formation of a welded seal, operation 1019 may include one or more of cutting, drilling, machining, grinding, or the like of the weld seal.

At operation 1021, in a specific embodiment, the crystalline material is removed from the interior region. Depending upon the embodiment, there can also be other steps, which can be inserted or added, or certain steps can also be removed. The method 1000 then ends at operation 1023.

Upon completion of method 1000, one or more free-standing ammonothermal group III metal nitride boules can be formed that reach a thickness that is greater than that of seed crystals 111, as measured in a thickness direction that is perpendicular to seed mounts 403, by greater than about 2 millimeters, greater than about 3 millimeters, greater than about 5 millimeters, greater than about 10 millimeters, greater than about 15 millimeters, greater than about 20 millimeters, greater than about 25 millimeters, or greater than about 40 millimeters, during the course of a single crystal growth run. In certain embodiments, the thickness direction is selected from one of [000-1], [0001], $\{1\,0\text{--}1\,0\}$, or $\{1\,0\text{--}1\pm1\}$.

The distribution of various impurities within the formed free-standing ammonothermal group III metal nitride boule may be sampled by preparing one or more test wafers by slicing parallel to the thickness direction and performing line scans or sampling at discrete points on the test wafer by calibrated secondary ion mass spectrometry (SIMS). In certain embodiments, one or more product wafers is prepared by slicing the free-standing ammonothermal group III metal nitride boule at an angle within 32 degrees, within 24 degrees, within 16 degrees, within 11 degrees, or within 4 degrees of the thickness direction. In certain embodiments, a surface of a test wafer or of a product wafer has impurity concentrations of O, H, carbon (C), Na, and K between about $1\times10^{16}$ cm$^{-3}$ and $5\times10^{19}$ cm$^{-3}$, between about $1\times10^{16}$ cm$^{-3}$ and $8\times10^{19}$ cm$^{-3}$, below $1\times10^{17}$ cm$^{-3}$, below $1\times10^{16}$ cm$^{-3}$, and below $1\times10^{16}$ cm$^{-3}$, respectively. In certain embodiments, a surface of a test wafer or of a product wafer has impurity concentrations of O, H, C, and at least one of F and Cl between about $1\times10^{16}$ cm$^{-3}$ and $5\times10^{19}$ cm$^{-3}$, between about $1\times10^{16}$ cm$^{-3}$ and $8\times10^{19}$ cm$^{-3}$, below $1\times10^{17}$ cm$^{-3}$, and between about $1\times10^{15}$ cm$^{-3}$ and $1\times10^{19}$ cm$^{-3}$, respectively. In certain embodiments, a free-standing ammonothermal group III metal nitride boule is characterized by a gradient in the concentration of at least one of oxygen and hydrogen between about $5\times10^{16}$ cm$^{-4}$ and about $1\times10^{21}$ cm$^{-4}$ and by the absence of a secondary concentration maximum within an outermost thickness, where the outermost thickness is at least about 10 millimeters, at least about 15 millimeters, at least about 20 millimeters, at least about 25 millimeters, or at least about 40 millimeters. The concentration of at least one of oxygen and hydrogen on the surface of a product wafer may vary smoothly, with no secondary maximum, along a direction along a projection of the growth direction on surface, where a width of the product wafer along the aforementioned direction is at least about 10 millimeters, at least about 15 millimeters, at least about 20 millimeters, at least about 25 millimeters, or at least about 40 millimeters.

In summary, method 1000 will generally include the following. First, provide an apparatus for high-pressure crystal growth or material processing, such as the ones described above, but there can be others, the apparatus comprising an interior region (for example, cylindrical in shape) surrounded by radial and axial restraint structures, and a closable opening region to the interior region. Second, provide one or more raw materials to the interior region and close and seal the opening region. Third, provide a solvent to the interior region. Fourth, provide the apparatus with thermal energy to cause an increase in temperature within the interior region to greater than 200 degrees Celsius to cause the solvent to be superheated. Fifth, form a crystalline material from a process of the superheated solvent. Sixth, remove thermal energy from the apparatus to cause a temperature of the capsule to change from a first temperature to a second temperature, which is lower than the first temperature. Seventh, release the solvent from the interior region. Eighth, open an opening region to the interior region of the high-pressure apparatus. Ninth, remove the crystalline material from the interior region. Next, optionally perform other steps, as desired.

The above sequence of steps provides a method according to an embodiment of the present disclosure. In a specific embodiment, the present disclosure provides a method and resulting crystalline material provided by a high-pressure apparatus where an elevated temperature is applied directly to seed crystals. Other alternatives can also be provided where steps are added, one or more steps are removed, or one or more steps are provided in a different sequence without departing from the scope of the claims herein. Details of the present method and structure can be found throughout the present specification and more particularly below.

The above sequence of steps provides a method according to an embodiment of the present disclosure. In a specific embodiment, the present disclosure provides a method and resulting crystalline material provided by a high-pressure apparatus where an elevated temperature is applied directly to seed crystals. Other alternatives can also be provided where steps are added, one or more steps are removed, or one or more steps are provided in a different sequence without departing from the scope of the claims herein.

In certain embodiments, a gallium-containing nitride crystal or boule grown by methods such as those described above is sliced or sectioned to form wafers. The slicing, sectioning, or sawing may be performed by methods that are known in the art, such as internal diameter sawing, outer diameter sawing, fixed abrasive multiwire sawing, fixed abrasive multiblade sawing, multiblade slurry sawing, multiwire slurry sawing, ion implantation and layer separation, or the like. The wafers may be lapped, polished, and chemical-mechanically polished according to methods that are known in the art.

One or more active layers may be deposited on the well-crystallized gallium-containing nitride wafer. The active layer may be incorporated into an optoelectronic or electronic devices such as at least one of a light emitting diode, a laser diode, a photodetector, a photodiode, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, and a diode for photoelectrochemical water splitting and hydrogen generation.

EXAMPLES

Embodiments provided by the present disclosure are further illustrated by reference to the following examples. It will be apparent to those skilled in the art that many modifications, both to materials and methods, may be practiced without departing from the scope of the disclosure.

Example 1

In one example of a crystal growth process, four c-plane GaN seed crystals were mounted in seed mounts similar to that shown schematically in FIGS. 5A and 5B, fabricated from pure silver, and welded to the inner diameter of a silver capsule having an inner diameter of 5.6 inches, similar to the arrangement shown in FIG. 4A. An additional 22 seed crystals were suspended from conventional furniture within a central portion of the lower half of the capsule. The capsule was filled with 93.1 g of HF mineralizer and 1.81 kg of ammonia and sealed. The lower end of the capsule was heated to a temperature of approximately 680 degrees Celsius and the upper end to a temperature of approximately 669 degrees Celsius, held at these temperatures for 50 hours, and then the upper end of the capsule was cooled to approximately 661 degrees Celsius. After holding at these temperatures for approximately 194 hours, the capsule was cooled, opened, and the grown crystals removed. The four crystals that were mounted proximate to the inner diameter of the capsule grew at an average rate of approximately 21 micrometers per hour, whereas the remaining crystals grew at an average rate of approximately 5 micrometers per hour.

Example 2

In another example of a crystal growth process, a cartridge heater, with a diameter of 0.25 inch, was placed within a heater sheath, consisting essentially of a silver tube, that was hermetically welded to the bottom of a capsule, as shown schematically in FIG. 9C, to form a central heating element. A seed mount 403 that included a seed mount region 405 that included a combined seed mount region and set of seed mounts was machined from a silver plate, with a central axial hole with a slip fit over the heater sheath. Then, 8 seed crystals were affixed to the seed mount surfaces 411, using silver tabs that were welded to the seed mounts and bent to clamp against the edges of the seed crystals. Nutrient material was placed around and above the seed crystals inside a silver capsule. The capsule was filled with 93.5 g of HF mineralizer and 1.85 kg of ammonia and sealed. Both the lower end and the upper end of the capsule were heated to a temperature of approximately 672 degrees Celsius, and seed mounts were heated to a temperature of approximately 682 degrees Celsius, as monitored by a thermocouple within the central heating element. After holding at these temperatures for approximately 300 hours, the capsule was cooled, opened, and the grown crystals removed. The 8 crystals that were attached to the seed mounts grew at an average rate of approximately 4 micrometers per hour. The material efficiency was approximately 90%.

Example 3

Figure 11:
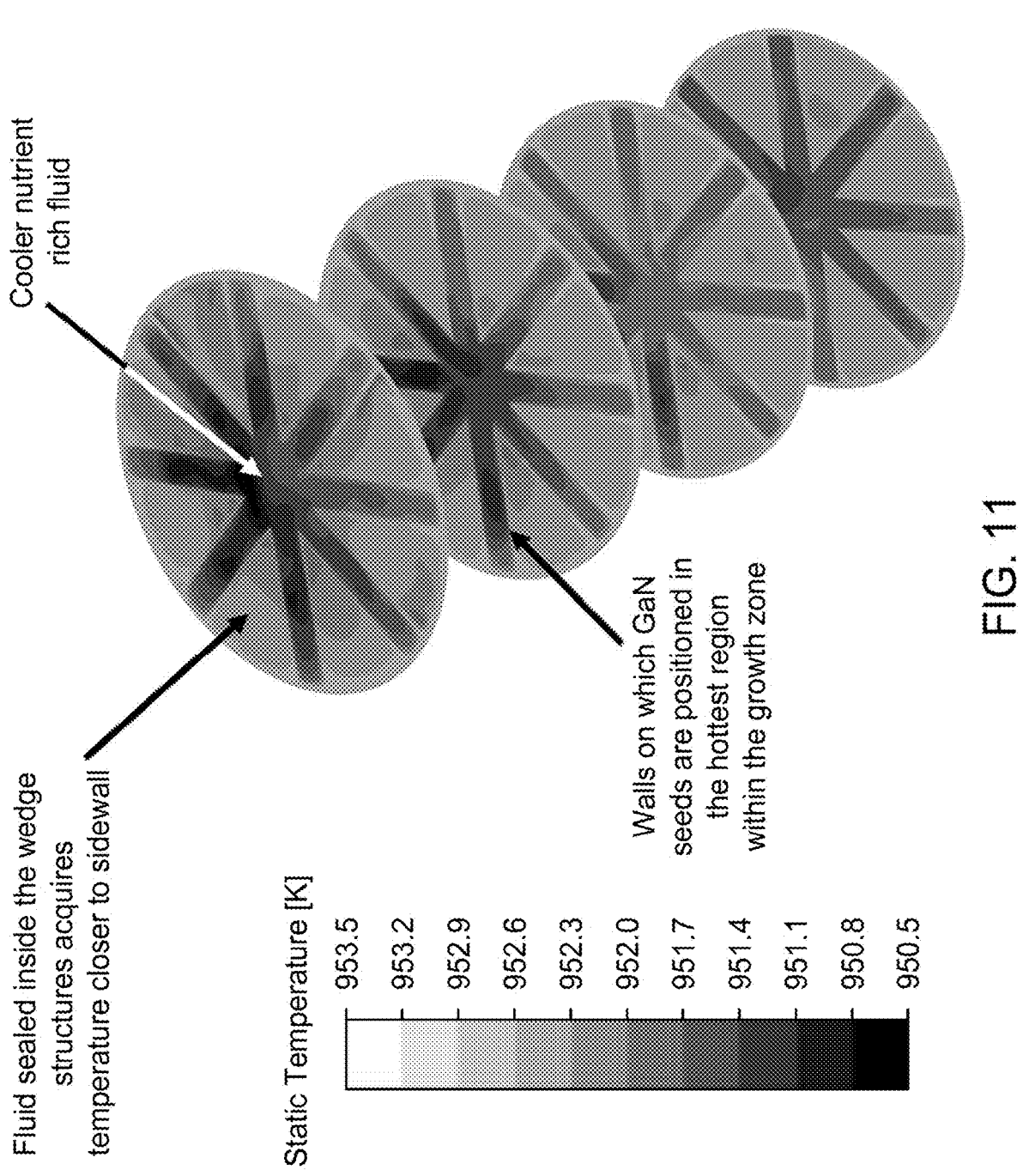
FIG. 11 is a schematic diagram showing calculated temperature distributions within a growth chamber according to an embodiment of the present disclosure.

In another example of a crystal growth process, an apparatus similar to that shown in FIG. 3 is provided, with a growth chamber having a configuration similar to that of FIGS. 6A and 6B. The height of the growth chamber is 483 millimeters, and the inner diameter is 142 millimeters. A double-conical-baffle is provided, with the aim of acting as a thermal break between the nutrient region and the growth region and to guide fluid from the nutrient region downward through a central region of the growth zone, as shown schematically in FIGS. 6B and 6A. The above features were modeled using the ANSYS suite of software, including ANSYS SPACECLAIM™ and ANSYS FLUENT™. A temperature boundary condition of 680 degrees Celsius was imposed on the inner diameter of the lower portion of the growth chamber, and a temperature boundary condition of 675 degrees Celsius was imposed on the inner diameter of the upper portion of the growth chamber, with the transition occurring over an axial distance of approximately 0.15 meters. The results of the steady-state calculation are summarized schematically in FIG. 11. The seed mount regions within the wedge-fin structures, and the seed mounts surrounding them, have temperatures that are constant within about 0.5 degrees Celsius. Fluid motion within interior region 103 is found to be predominantly downward, whereas fluid motion within vertical channels 615 is found to be predominantly upward. The fluid within the vertical channels 615 is found to be cooler, by approximately 1 to 3 degrees Celsius, than the temperature of the seed mounts.

Example 4

Figure 12A:
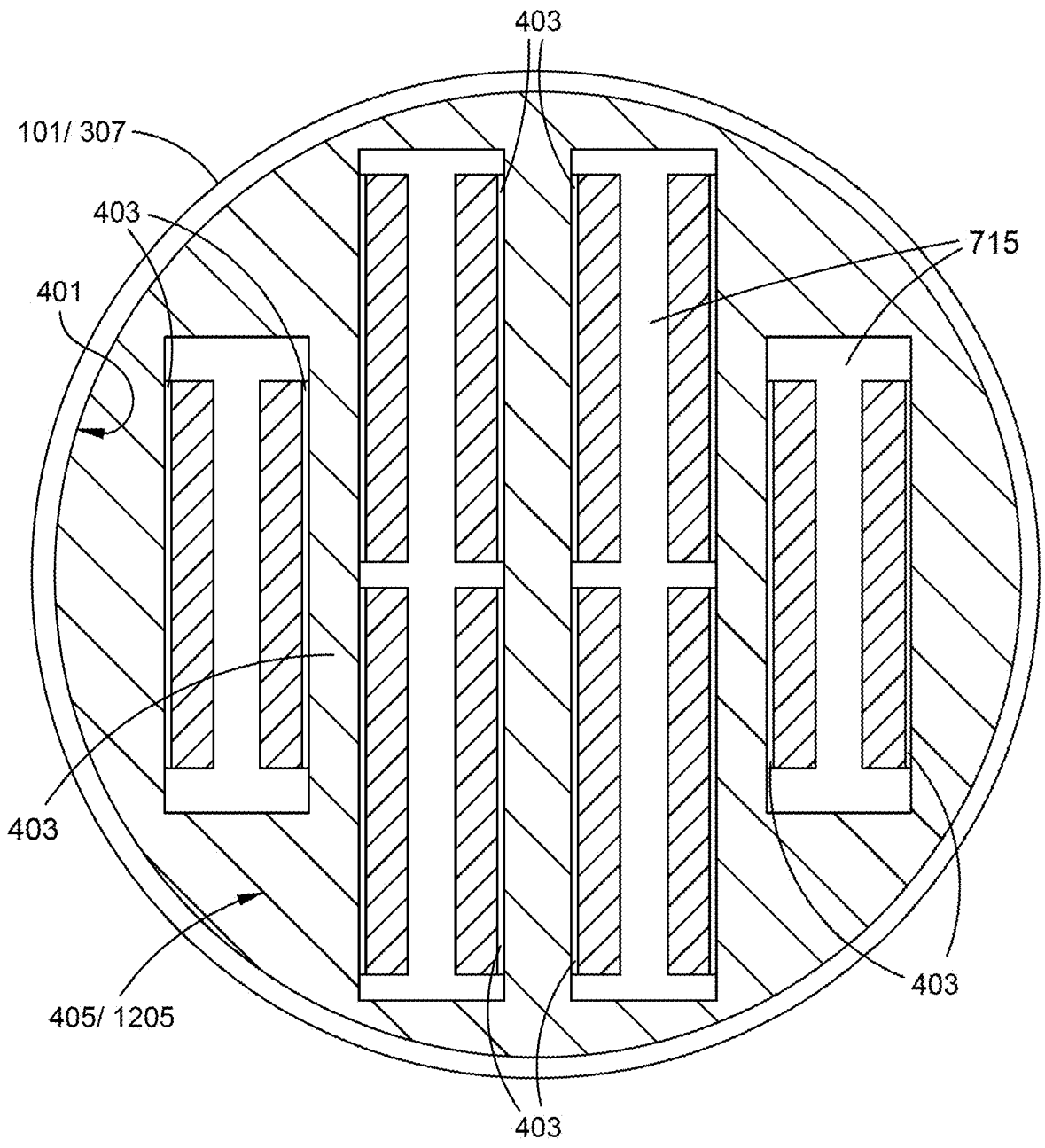
FIGS. 12A and 12B are schematic diagrams showing calculated temperature distributions within a growth chamber according to an embodiment of the present disclosure.
Figure 12B:
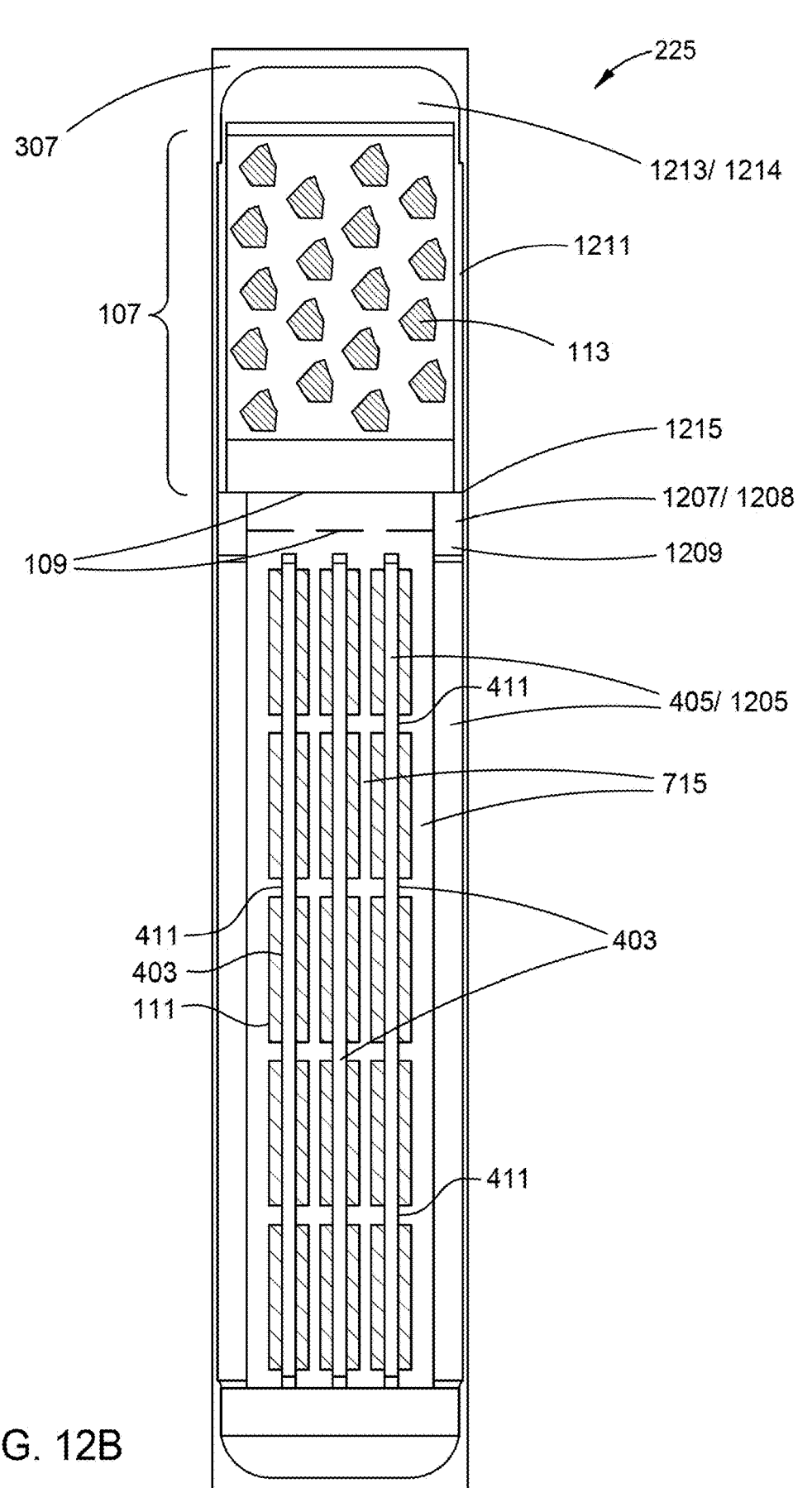
Figure 12C:
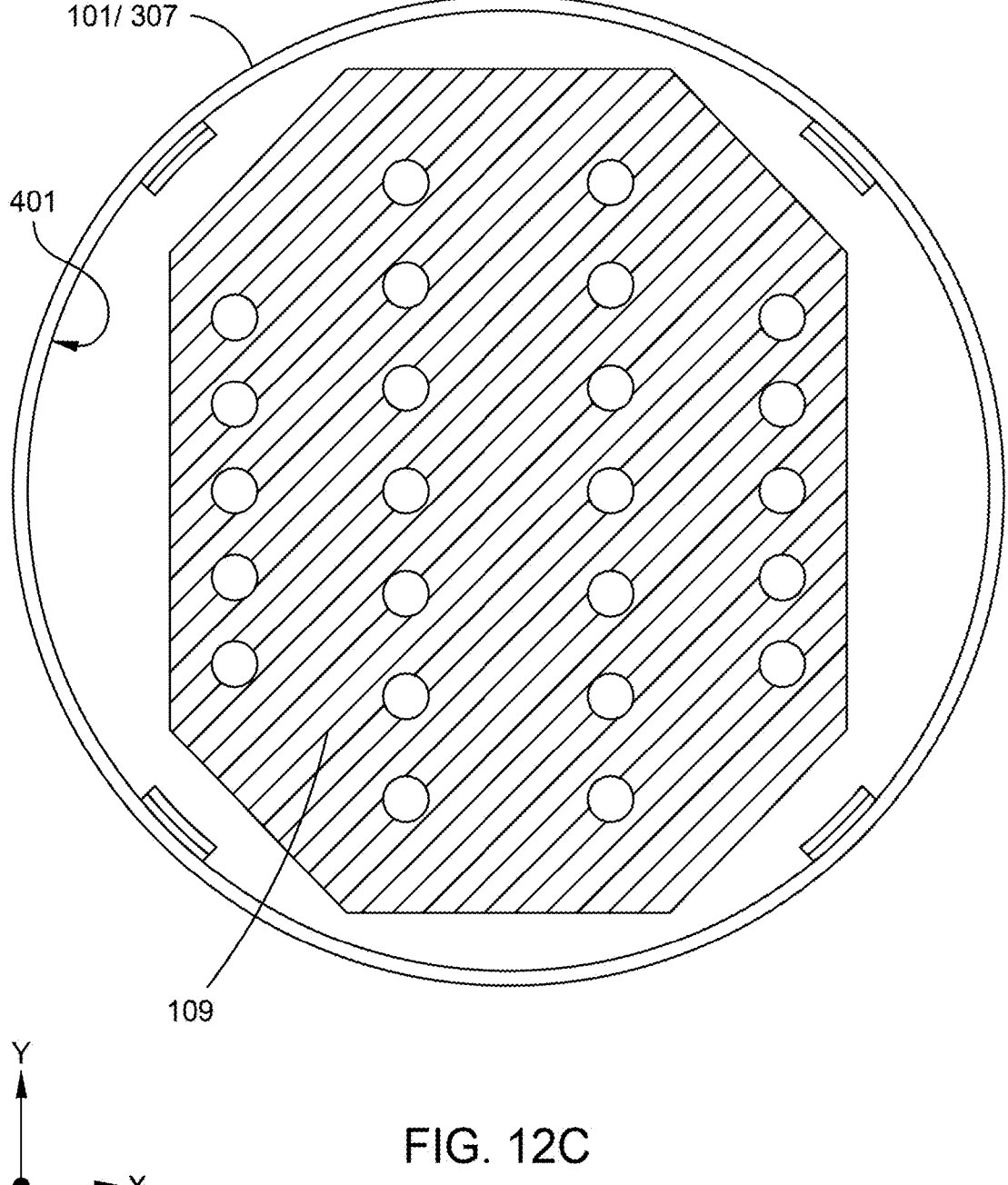
FIG. 12C is a schematic diagram showing a lower baffle according to an embodiment of the current disclosure.
Figure 12D:
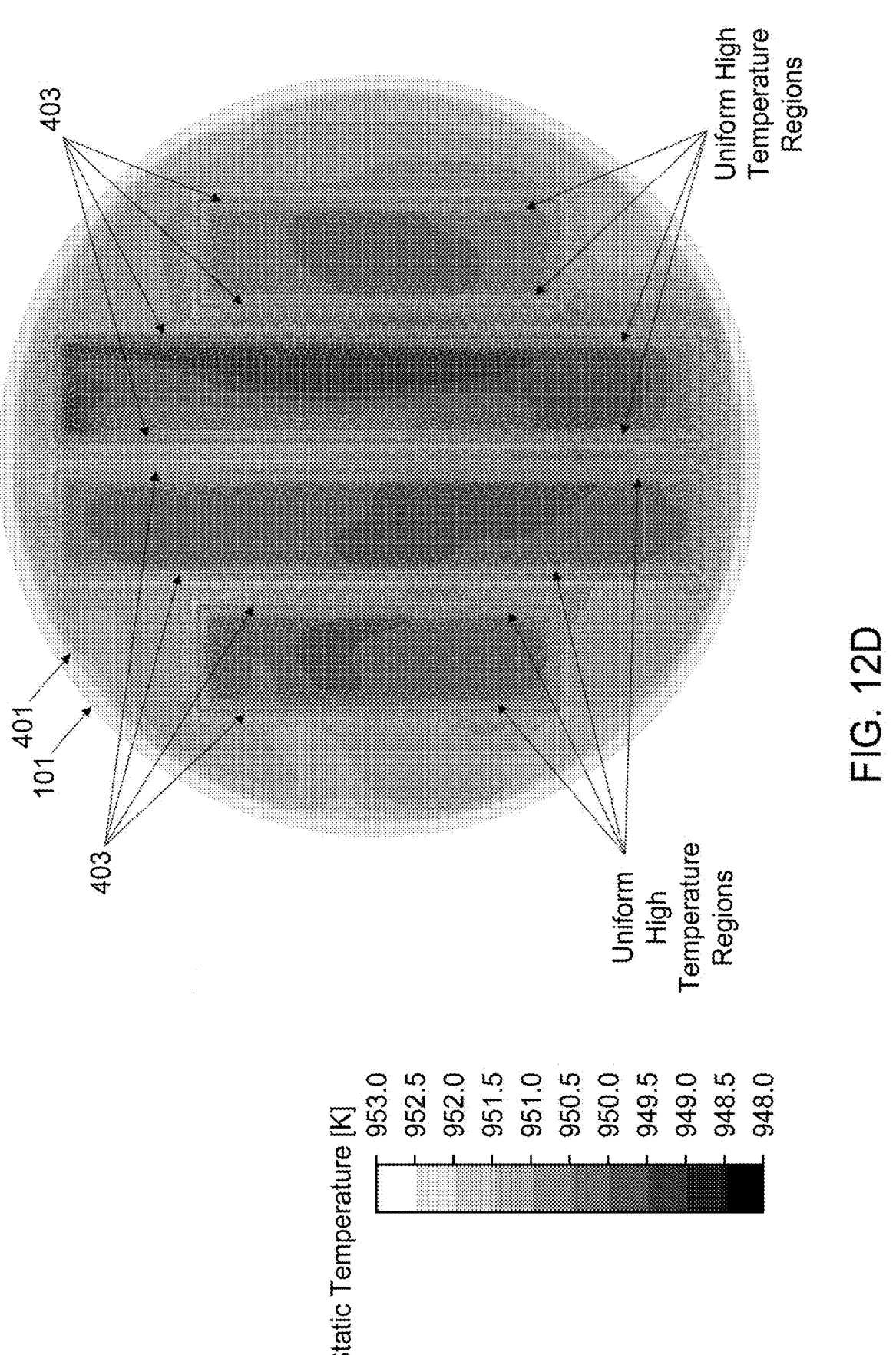
FIG. 12D is a schematic diagram summarizing the results of a steady-state computational fluid dynamics (CFD) calculation according to an embodiment of the current disclosure.

In another example of a crystal growth process, an apparatus similar to that shown in FIG. 3 is provided, with a growth chamber having a configuration similar to that of FIGS. 7C and 7D, except with four vertical channels rather than five. A horizontal cross section of the growth zone is shown schematically in FIG. 12A, and an axial cross section of the growth chamber is shown schematically in FIG. 12B. The height of the growth chamber is 483 millimeters, and the inner diameter is 142 millimeters. Referring to FIGS. 12A and 12B, growth chamber 101 includes a capsule 307. A fluid for crystal growth is enclosed within vertical channels 715, with seed mounts 403 separating the crystal growth fluid from a single seed mount region 405, which is filled with a lower thermal management fluid 1205 during operation. The upper boundary and lower boundary of seed mount region 405 are terminated with structures analogous to that shown schematically in FIG. 7D. An outer baffle 1209, having an open area less than 1%, relative to a cross-sectional area of an inner diameter of growth chamber 101, separates an outer portion of seed mount region 405 from intermediate chamber 1207, which is filled with intermediate thermal management fluid 1208 during operation. A double-flat-baffle 109 is provided, with the aim of acting as a thermal break between the nutrient region and the growth region. An example of a lower baffle is schematically illustrated in FIG. 12C. The above features were modeled using the ANSYS suite of software, including ANSYS SPACECLAIM™ and ANSYS FLUENT™. Nutrient 113 within nutrient region 107 was modeled as a porous bed. Nutrient region 107 was enclosed by a nutrient boundary 1211, with upper chamber 1213, which is filled with upper thermal management fluid 1214 during operation, above and lateral to boundary 1211. A percent open area between nutrient boundary 1211 and upper chamber 1213 was less than 1%, expressed with respect to a cross section of growth chamber 101. Upper chamber 1213 and intermediate chamber 1207 were separated by upper outer baffle 1215, which has a percent open area, expressed with respect to a cross section of growth chamber 101, less than 1%. A temperature boundary condition of 680 degrees Celsius was imposed on the inner diameter of the lower portion of the growth chamber, and a temperature boundary condition of 675 degrees Celsius was imposed on the inner diameter of the upper portion of the growth chamber, with the transition occurring over an axial distance of approximately 0.15 meters. The results of the steady-state computational fluid dynamics (CFD) calculation are summarized schematically in FIG. 12D. Referring to FIG. 12D, one skilled in the art will appreciate that the temperature variation in a region adjacent to and positioned over the surface of the seed mount regions 403, as highlighted by a thin light grey colored region, has a uniform high temperature which will promote crystal growth at approximately equal rates on each of the seed mounts 403. The seed mount regions within the vertical channel structures 715, and the seed mounts 403 surrounding them, are cooler than the growth chamber inner diameter by about 3 degrees Celsius, but have temperatures that are constant within about 0.5 degrees Celsius. At a given quasi-steady-state solution, fluid motion within vertical verticals is found to be predominantly downward on one end of the channel and predominantly upward at the other end of the channel, with the "up" and "down" positions switching intermittently. The fluid within the vertical channels 715 is found to be cooler, by approximately 1 to 3 degrees Celsius, than the temperature of the seed mounts 403.

While the foregoing is directed to embodiments of the present disclosure, other and further embodiments of the disclosure may be devised without departing from the basic scope thereof, and the scope thereof is determined by the claims that follow.

What is claimed is:

1. An apparatus for solvothermal crystal growth, comprising:

an enclosure configured to contain a material at a pressure above about 5 megapascal and at a temperature above about 200° C., wherein the enclosure comprises an interior region and a central axis that extends in a first direction;

one or more heating elements disposed within the interior region of the enclosure; and a plurality of seed mounts disposed within the interior region, wherein a surface of each of the seed mounts is configured to receive a seed crystal, wherein;

each of the plurality of seed mounts are disposed in an array that extends in the first direction, at least a portion of a seed mount region is disposed between the surface of each of the seed mounts and at least one of the one or more heating elements disposed within the interior region of the enclosure, wherein the seed mount region comprises a heat transfer medium, and the seed mount regions are in direct contact with at least one of the one or more heating elements disposed within the interior region of the enclosure or are disposed proximate to at least one of the one or more heating elements disposed within the interior region of the enclosure.

2. The apparatus of claim 1, wherein the heat transfer medium comprises at least one material having a thermal conductivity above about 50 W/m-K.

3. The apparatus of claim 1, further comprising a seed crystal gap formed between a back side of a seed crystal and the seed mount, wherein the seed crystal gap is between about 25 micrometers and about 5 millimeters (mm).

4. The apparatus of claim 1, further comprising a heater that at least partially surrounds an outer surface of the enclosure, wherein each of the plurality of seed mounts are positioned a distance from at least one of the one or more heating elements disposed within the interior region of the enclosure so that an average temperature formed across the surface of the seed mount is between zero and about 10° C. below the maximum value of a temperature of at least one of the one or more heating elements disposed within the interior region of the enclosure at the same height as the seed mount during a solvothermal crystal growth process.

5. The apparatus of claim 4, wherein an average temperature formed across the surface of the surface of each of the seed mounts within the array of seed mounts is less than about 5° C. below the maximum value of a temperature of at least one of the one or more heating elements disposed within the interior region of the enclosure at the same height as the seed mount during a solvothermal crystal growth process.

6. The apparatus of claim 1, wherein one or more heating elements of the plurality of heating elements are disposed within a sheath that is hermetically sealed with respect to the interior region.

7. The apparatus of claim 6, wherein one or more heating elements are disposed within at least one seed mount region of a seed mount, wherein the seed mount is disposed on a vane member of at least two vane members that are arranged symmetrically around a central axis of the enclosure.

8. The apparatus of claim 6, wherein the one or more heating elements are disposed within at least one seed mount region of a seed mount, wherein the seed mount is disposed on a vane member of a plurality of vane members.

9. The apparatus of claim 6, wherein the one or more heating elements are disposed within at least one seed mount region of a seed mount, wherein the at least one seed mount region comprises a wall defining and enclosing the seed mount region and is filled with a supercritical fluid having essentially the same composition as a supercritical fluid present within the interior region.

10. The apparatus of claim 9, wherein each of the seed mount regions further comprises at least one horizontal baffle, the horizontal baffles having a percent open area between 0.5% and 20% with respect to a cross-sectional area of the seed mount region in a direction perpendicular to the central axis.

11. The apparatus of claim 10, wherein each wall defining and enclosing a seed mount region comprises an opening that defines a seed mount region of the seed mount regions, wherein the opening comprises an open cross-sectional area, which expressed as a percentage of a cross-sectional area of the interior region, is less than about 1%.

12. The apparatus of claim 1, further comprising at least one basket member for nutrient that is positioned laterally with respect to at least one seed mount of the plurality of seed mounts.

13. The apparatus of claim 12, further comprising at least two zone separators, a first zone separator of the at least two zone separators separating a first region of nutrient from a second region of nutrient and a second zone separator of the at least two zone separators separating at least one first seed mount from at least one second seed mount, and the first and second zone separators, the first nutrient region and the at least one first seed mount forming a growth tier within the interior region.

14. The apparatus of claim 1, wherein the heat transfer medium comprises at least one material having a thermal conductivity above about 100 W/m-K.

15. The apparatus of claim 1, further comprising at least one seed bracket, the seed bracket being configured to hold at least one seed crystal at a separation of one millimeter or less with respect to a seed mount of the plurality of seed mounts.

16. The apparatus of claim 1, wherein at least one seed mount is configured to receive a seed crystal having a maximum dimension or diameter that is within at least 75% of an inner diameter of the interior region.

17. The apparatus of claim 1, wherein an angle $\theta$ between a plane that is parallel to a surface of at least one of the seed mounts that is configured to receive a seed crystal and the central axis has a value between 0 degrees and 90 degrees.

18. The apparatus of claim 17, wherein $\theta$ has a value between 20 degrees and 70 degrees.

19. The apparatus of claim 17, wherein $\theta$ has a value between 40 degrees and 60 degrees.

20. The apparatus of claim 17, further comprising at least one growth baffle positioned between at least one pair of axially-adjacent seed mounts, the at least one growth baffle being tilted from horizontal by an angle within 10 degrees of the value of $\theta$.

\* \* \* \* \*